(12) United States Patent
Foley

(10) Patent No.: US 9,584,105 B1
(45) Date of Patent: Feb. 28, 2017

(54) TIMING GENERATOR FOR GENERATING HIGH RESOLUTION PULSES HAVING ARBITRARY WIDTHS

(71) Applicant: ANALOG DEVICES, INC., Norwood, MA (US)

(72) Inventor: David P. Foley, Chelmsford, ME (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/066,182

(22) Filed: Mar. 10, 2016

(51) Int. Cl.
  *H03L 7/06* (2006.01)
  *H03K 5/13* (2014.01)
  *H03L 7/08* (2006.01)
  *H03K 5/00* (2006.01)

(52) U.S. Cl.
  CPC ............... *H03K 5/133* (2013.01); *H03L 7/08* (2013.01); *H03K 2005/00019* (2013.01)

(58) Field of Classification Search
  USPC .................................. 327/147–149, 156–158
  See application file for complete search history.

(56) References Cited

U.S. PATENT DOCUMENTS

| | | |
|---|---|---|
| 4,675,546 A | 6/1987 | Shaw |
| 5,376,849 A | 12/1994 | Dickol et al. |
| 5,554,946 A | 9/1996 | Curran et al. |
| 5,900,761 A | 5/1999 | Hideno et al. |
| 5,963,074 A | 10/1999 | Arkin |
| 6,100,735 A | 8/2000 | Lu |
| 6,472,921 B1 | 10/2002 | Rao et al. |
| 6,683,928 B2 * | 1/2004 | Bhullar .................. H03L 7/0814 327/156 |
| 6,819,190 B2 | 11/2004 | Pearce et al. |
| 6,909,311 B2 | 6/2005 | Foley et al. |
| 7,072,433 B2 | 7/2006 | Bell |
| 7,126,407 B2 | 10/2006 | Furtner |
| 7,265,594 B2 | 9/2007 | Nakamura et al. |
| 7,403,054 B1 | 7/2008 | Malladi et al. |
| 7,636,150 B1 | 12/2009 | McCauley et al. |
| 7,750,712 B2 | 7/2010 | Ide et al. |
| 7,863,954 B2 | 1/2011 | Millar |
| 8,093,937 B2 | 1/2012 | Kwak et al. |
| 8,212,908 B2 | 7/2012 | Nagase et al. |
| 8,265,216 B2 | 9/2012 | Soni et al. |
| 8,564,345 B2 | 10/2013 | Yu |
| 8,625,654 B2 | 1/2014 | Jeong et al. |

(Continued)

FOREIGN PATENT DOCUMENTS

EP  0600815  11/1993

*Primary Examiner* — Adam Houston
(74) *Attorney, Agent, or Firm* — Patent Capital Group

(57) ABSTRACT

An exemplary timing generator includes a coarse delay circuit configured to generate a coarse delayed rising edge signal and a coarse delayed falling edge signal from a reference timing signal; a fine delay circuit configured to generate a fine delayed rising edge signal from the coarse delayed rising edge signal and a fine delayed falling edge signal from the coarse delayed falling edge signal; an edge combiner configured to generate the timing signal based on the fine delayed rising edge signal and the fine delayed falling edge signal; and a masking circuit configured to generate a rising edge masking signal and a falling edge masking signal for controlling when the rising edges and the falling edges of the timing signal are generated.

23 Claims, 11 Drawing Sheets

(56) References Cited

U.S. PATENT DOCUMENTS

| | | | |
|---|---|---|---|
| 8,664,994 B1 | 3/2014 | Amrutur et al. | |
| 8,803,577 B2 | 8/2014 | Park et al. | |
| 2003/0095009 A1* | 5/2003 | Gomm | H03K 5/135 331/57 |
| 2003/0128783 A1 | 7/2003 | Richards et al. | |
| 2007/0188206 A1* | 8/2007 | Lee | H03L 7/07 327/158 |
| 2007/0200604 A1* | 8/2007 | Yun | H03L 7/0814 327/158 |
| 2007/0210842 A1* | 9/2007 | Kawamoto | H03L 7/0812 327/158 |
| 2008/0291080 A1 | 11/2008 | Wilens et al. | |
| 2009/0002040 A1* | 1/2009 | Oh | G11C 7/22 327/158 |
| 2009/0167388 A1* | 7/2009 | Lee | H03L 7/0812 327/158 |
| 2009/0180341 A1* | 7/2009 | Ide | H03K 5/15066 365/203 |
| 2011/0221495 A1* | 9/2011 | Lee | H03K 5/1565 327/158 |
| 2011/0248752 A1* | 10/2011 | Willey | H03K 5/1565 327/117 |
| 2012/0154001 A1* | 6/2012 | Seo | H03L 7/0814 327/158 |
| 2012/0182053 A1* | 7/2012 | Yang | H03L 7/16 327/119 |
| 2012/0206633 A1 | 8/2012 | Huo et al. | |
| 2013/0229214 A1* | 9/2013 | Ichida | H03L 7/081 327/158 |
| 2013/0265090 A1* | 10/2013 | Ma | G11C 7/222 327/161 |
| 2013/0300469 A1* | 11/2013 | Kelkar | H03L 7/081 327/157 |
| 2014/0002149 A1* | 1/2014 | Jang | H03H 11/265 327/149 |
| 2014/0021990 A1* | 1/2014 | Na | H03L 7/10 327/158 |
| 2014/0103985 A1 | 4/2014 | Andreev et al. | |
| 2014/0203854 A1* | 7/2014 | Jung | H03L 7/0802 327/158 |
| 2014/0266837 A1 | 9/2014 | Henzler et al. | |
| 2015/0171848 A1* | 6/2015 | Bruennert | H03K 5/14 327/276 |
| 2015/0204970 A1 | 7/2015 | Jeong et al. | |
| 2015/0253417 A1 | 9/2015 | Patil et al. | |
| 2015/0263740 A1* | 9/2015 | Jung | H03L 7/0812 327/158 |
| 2015/0372683 A1* | 12/2015 | Takahashi | G11C 11/4076 365/233.1 |
| 2016/0028409 A1* | 1/2016 | Yoshizawa | H03L 7/0816 327/158 |
| 2016/0056806 A1* | 2/2016 | Rapinoja | H03L 7/0816 327/158 |

* cited by examiner

US 9,584,105 B1

TIMING GENERATOR FOR GENERATING HIGH RESOLUTION PULSES HAVING ARBITRARY WIDTHS

TECHNICAL FIELD

The present disclosure relates generally to timing generators and associated methods for generating timing signals.

BACKGROUND

Timing generators are extensively used in various applications, such as depth-imaging devices. Generally, depth-imaging devices generate images in three dimensions (for example, x-direction, y-direction, and z-direction), allowing depth-imaging devices to detect movement for gesture control and/or other three-dimensional vision applications. Time-of-flight (TOF) sensing is one technique employed by depth-imaging devices. TOF sensing measures a travel time required for light emitted by a depth-imaging device to reach a target and return as reflected light to the depth-imaging device. The travel time (often referred to as a time delay) is measured as a phase shift between the emitted light and the reflected light, which can be used to calculate a distance. Depth-imaging devices include an image sensor for sensing the reflected light and generating analog signals representing imaging information. Timing generators for generating timing signals for operating the image sensor, along with other components of the depth-imaging device, are typically required. Although existing timing generators and associated methods for generating timing signals have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
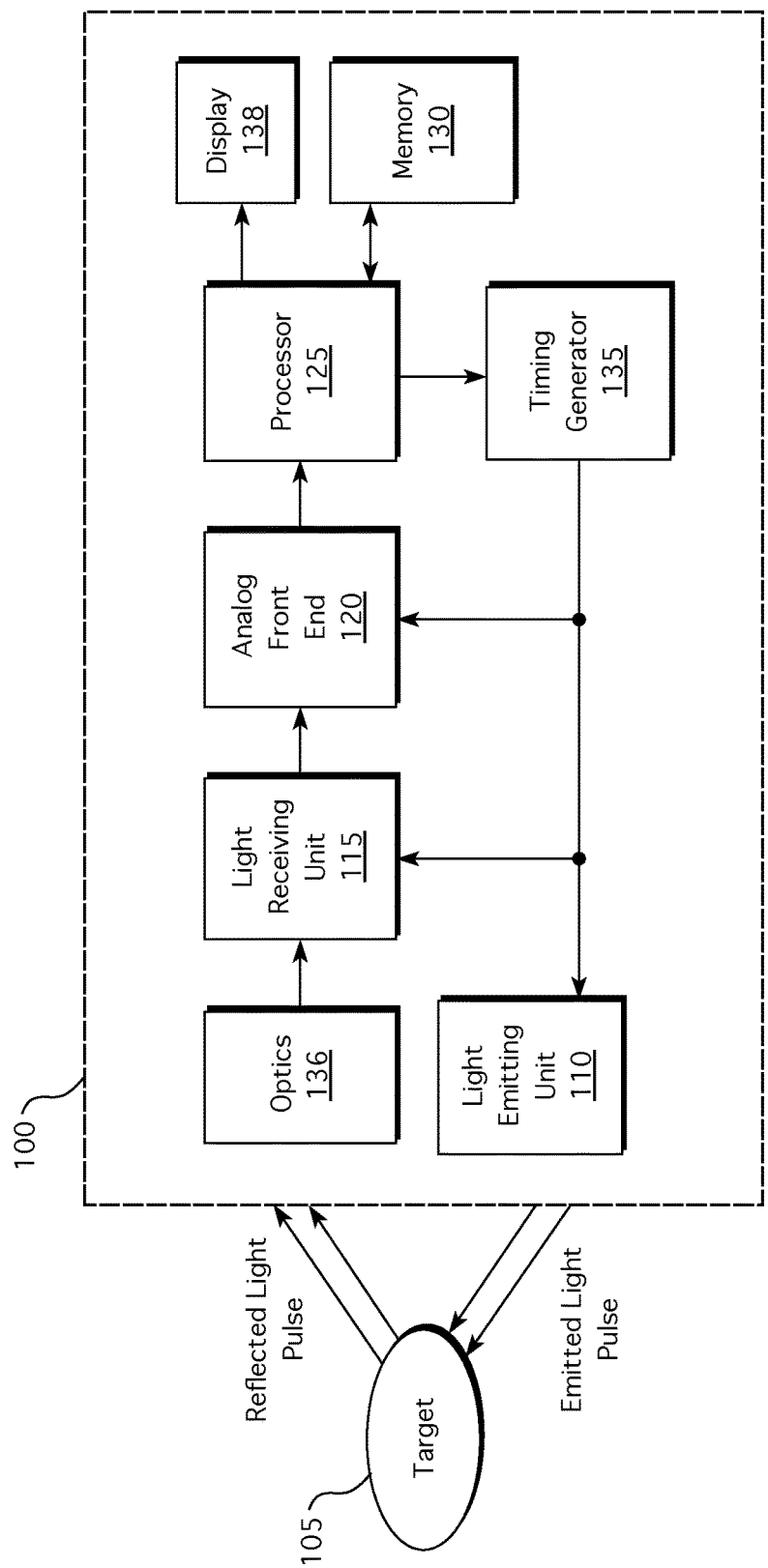
FIG. 1 depicts an exemplary time-of-flight (TOF) camera system according to various aspects of the present disclosure.

A timing generator and associated methods for generating timing signals are described herein. The disclosed timing generator generates high resolution pulses with arbitrary pulse widths. For example, the timing generator can place both rising edges and falling edges of pulses in a timing signal with a resolution finer than a clock period of a reference timing signal. In some implementations, the timing generator can achieve a resolution of 30 ps for placing rising edges and/or falling edges of pulses in timing signals. The timing generator implements a masking mechanism for achieving pulse widths less than and greater than a clock period of the reference timing signal.

An exemplary timing generator includes a coarse delay circuit configured to generate a coarse delayed rising edge signal and a coarse delayed falling edge signal from a reference timing signal; a fine delay circuit configured to generate a fine delayed rising edge signal from the coarse delayed rising edge signal and a fine delayed falling edge signal from the coarse delayed falling edge signal; an edge combiner configured to generate the timing signal from the fine delayed rising edge signal and the fine delayed falling edge signal; and a masking circuit configured to generate a rising edge masking signal and a falling edge masking signal for controlling when the rising edges and the falling edges of the timing signal are generated. In some implementations, the masking circuit is configured to control when the fine delay circuit receives the coarse delayed rising edge signal and the coarse delayed falling edge signal. In some implementations, the masking circuit is configured to control when the edge combiner receives the fine delayed rising edge signal and the fine delayed falling edge signal. In some implementations, the fine delay circuit has a maximum fine delay interval that overlaps a coarse delay interval of the coarse delay circuit. In some implementations, the fine delay circuit is configured to calibrate the coarse delay circuit.

The fine delay circuit includes a fine delay rising edge circuit configured to shift edges of coarse delayed rising edge signal by a rising edge fine delay interval; and a fine delay falling edge circuit configured to shift edges of coarse delayed falling edge signal by a falling edge fine delay interval. In some implementations, the fine delay rising edge circuit includes at least two fine delay stages connected in series. Each fine delay stage includes a first delay path for delaying the coarse delayed rising edge signal by a fine delay interval, a second delay path for passing the coarse delayed rising edge signal without any delay, and a selection circuit for selecting the first delay path or the second delay path for the coarse delayed rising edge signal. In some implementations, the fine delay falling edge circuit includes at least two fine delay stages connected in series. Each fine delay stage includes a first delay path for delaying the coarse delayed falling edge signal by a fine delay interval, a second delay path for passing the coarse delayed falling edge signal without any delay, and a selection circuit for selecting the first delay path or the second delay path for the coarse delayed falling edge signal. In some implementations, for the fine delay rising edge circuit and the fine delay falling edge circuit, the selection circuits are configured to select the first delay path or the second delay path by setting a state of a transistor.

The masking circuit includes a rising edge masking circuit configured to mask coarse delayed rising edge signal from fine delay circuit based on a rising edge mask control signal; and a falling edge masking circuit configured to mask coarse delayed falling edge signal from fine delay circuit based on a falling edge mask control signal. The timing generator can further include a processor core configured to generate the rising edge mask control signal and the falling edge mask control signal using the reference timing signal as a processor core clock. The masking circuit can be configured to control which clock period of the reference timing signal that a rising edge and a falling edge of a pulse of the timing signal is generated.

In some implementations, the coarse delay circuit is configured to generate a coarse delay control voltage for locking a coarse delay of the coarse delay circuit, and further wherein the fine delay circuit generates the fine delayed rising edge signal and the fine delayed falling edge signal as a function of the coarse delay control voltage. In some implementations, the coarse delay circuit includes a delay-locked loop based phase generator that includes a delay line configured to generate delay signals from a reference timing signal, each delay signal having a phase delayed relative to the reference timing signal, and a selection circuit configured to select one of the delay signals for the coarse delayed rising edge signal and one of the delay signals for the coarse delayed falling edge signal. The delay-locked loop based phase generator can further include a feedback control system configured to generate the coarse delay control voltage for locking a coarse delay of the delay line.

In some implementations, the timing generator can further include a memory configured to store timing information for a rising edge location control signal, a falling edge location control signal, a fine delay rising edge control signal, and a fine delay falling edge control signal. The coarse delay circuit can generate the coarse delayed rising edge signal based on the rising edge location control signal and the coarse delayed falling edge signal based on the falling edge location control signal. The fine delay circuit can generate the fine delayed rising edge signal based on the fine delay rising edge control signal and the fine delayed falling edge signal based on the fine delay falling edge control signal.

DETAILED DESCRIPTION OF EXAMPLE EMBODIMENTS

Generally, depth-imaging devices generate images in three dimensions (for example, x-direction, y-direction, and z-direction), allowing depth-imaging devices to detect movement for gesture control and/or other three-dimensional vision applications. Time-of-flight (TOF) sensing is one technique employed by depth-imaging devices. TOF sensing measures a travel time required for light emitted by a depth-imaging device to reach a target and return as reflected light to the depth-imaging device. The travel time (often referred to as a time delay) is measured as a phase shift between the emitted light and the reflected light, which can be used to calculate a distance (depth). Depth-imaging devices include an image sensor, such as a charge coupled device (CCD) and/or a complementary metal-oxide-semiconductor (CMOS) device, for sensing (capturing) the reflected light and generating analog signals representing imaging information. Timing generators for generating timing signals for operating the image sensor, along with other components of the depth-imaging device, are typically required.

FIG. 1 depicts an exemplary depth-imaging device, such as a time-of-flight (TOF) camera system 100, according to various aspects of the present disclosure. TOF camera system 100 is an electronic device (including an electronic circuit and/or one or more electronic components) configured to determine a distance to a target 105 by measuring a time between when TOF camera system 100 emits a light signal and receives a reflected light signal from target 105. TOF camera system 100 generally includes a light emitting unit 110, a light receiving unit 115, an analog front end 120, a processor 125, a memory 130, and a timing generator 135 electrically coupled. Light emitting unit 110 illuminates target 105 with pulses of light (referred to as emitted light pulses), such as pulses of infrared light, and light receiving unit 115 captures pulses of light reflected from target 105 (referred to as reflected light pulses). Light emitting unit 110 includes any suitable light source, such as light emitting diodes, laser diodes, other suitable light source, or combination thereof. Light receiving unit 115 includes a sensor, such as a CCD sensor and/or a CMOS sensor, for receiving and storing the reflected light pulses at times (or phases) delayed relative to emitted light pulses based on a distance of target 105 from TOF system 100. In some implementations, the sensor includes a two-dimensional pixel array, where each pixel receives reflected light pulses. In some implementations, TOF camera system 100 can further include optics 138 for gathering, filtering, and/or focusing emitted light pulses on target 105 and/or reflected light pulses on light receiving unit 115. Analog front end 120 conditions, samples, and/or converts analog signals received from light receiving unit 115 into digital signals (digital data) for processing and evaluating by processor 125. For example, processor 125 can execute instructions stored in processor 125 and/or memory 130 that cause processor 125 to evaluate information associated with the emitted light pulses and the reflected light pulses, such as time delays (time-of-flights) between when TOF system 100 generates emitted light pulses and when TOF system 100 receives respective reflected light pulses. In some implementations, processor 125 calculates depth information for use in forming three-dimensional images, for example, for display on a display 138. Timing generator 135 generates timing signals for operating and synchronizing various components of TOF system 100, such as light emitting unit 110, light receiving unit 115, and/or analog front end 120. For example, light emitting unit 110 emits light pulses having defined characteristics (such as defined pulse widths) based on timing signals received from timing generator 135. In another example, light receiving unit 115 clears, collects, and transfers information associated with light reflected pulses based on timing signals received from timing generator 135. In another example, analog front end 120 converts analog signals to digital signals based on timing signals received from timing generator 135. In some implementations, processor 125 can communicate instructions to timing generator 135 for generating specified timing signals. FIG. 1 has been simplified for the sake of clarity to better understand the inventive concepts of the present disclosure. Additional features can be added in TOF camera system 100, and some of the features described below can be replaced or eliminated in other embodiments of TOF camera system 100.

Figure 2:
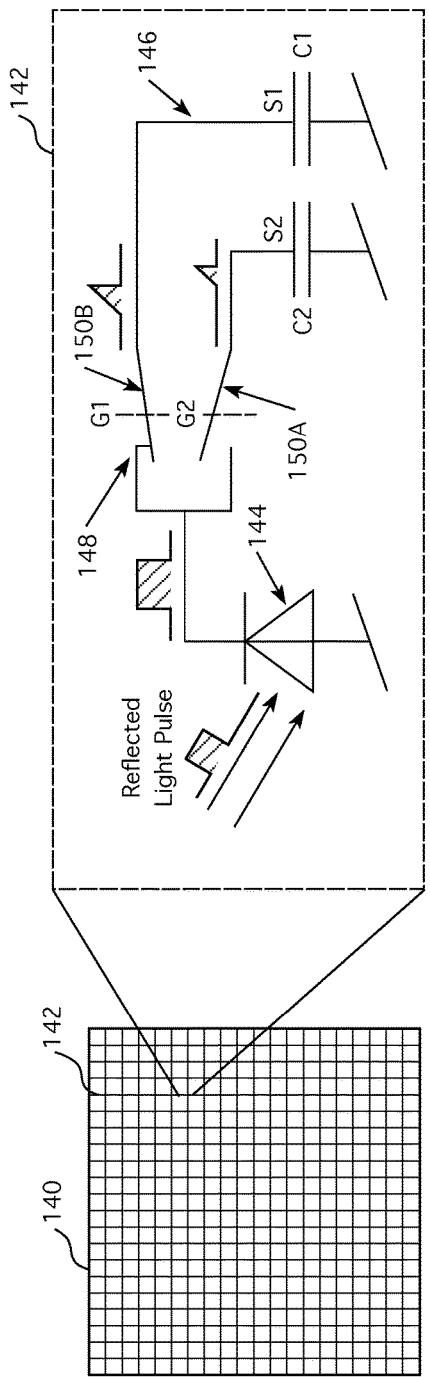
FIG. 2 depicts an exemplary two-dimensional pixel array, which can be implemented in the TOF camera system of FIG. 1, according to various aspects of the present disclosure.

FIG. 2 depicts an exemplary two-dimensional pixel array 140, which can be implemented in a sensor of light receiving unit 115 in TOF camera system 100 of FIG. 1, according to various aspects of the present disclosure. In FIG. 2, pixel array 140 includes numerous pixels, such as a pixel 142, arranged in rows and columns. Pixel 142 includes a photosensitive element 144 that converts reflected light pulses (such as light reflected from target 105) into a charge (current) that is proportional to reflected light received on pixel 142 at designated time intervals. In the depicted embodiment, pixel 142 clears, stores, and transfers charge associated with reflected light pulses using analog timing. For example, pixel 142 includes a memory element 146 (here, a capacitor C1 and a capacitor C2) and a switch element 148 (here, a switch G1 and a switch G2), where charge (depicted as reflected light signal S1 and reflected light signal S2) from photosensitive element 144 is directed to capacitor C1 or capacitor C2 based on a state of switch G1 and a state of switch G2, which are controlled respectively by a switch timing control signal 150A and a switch timing control signal 150B. When implemented in TOF system 100, light receiving unit 115 can generates analog signal (analog data) that correspond to charge collected by pixels, such as pixel 142, of pixel array 140. FIG. 2 has been simplified for the sake of clarity to better understand the inventive concepts of the present disclosure. Additional features can be added in pixel array 140, and some of the features described below can be replaced or eliminated in other embodiments of pixel 140.

Figure 3:
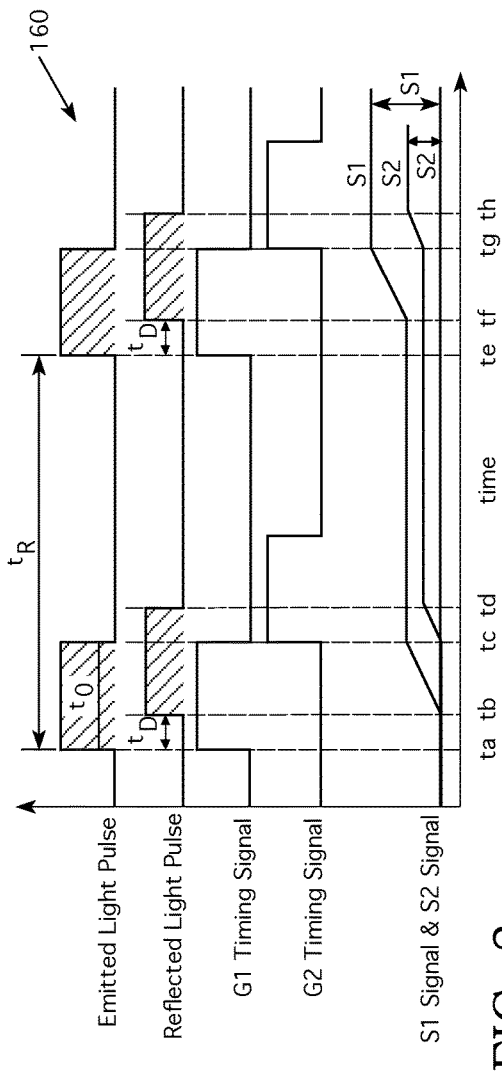
FIG. 3 includes a timing diagram that illustrates timing signals associated with a pixel in a pixel array, such as the pixel array in FIG. 2, according to various aspects of the present disclosure.

FIG. 3 illustrates a timing diagram 160 associated with timing signals associated with a pixel in a pixel array implemented in an image sensor of a TOF camera system, such as pixel 142 of pixel array 140 implemented in light receiving unit 115 of TOF camera system 100, according to various aspects of the present disclosure. Timing diagram 160 includes an emitted light pulse waveform that includes emitted light pulses having a pulse width $t_0$ generated by light emitting unit 110, and a reflected light pulse waveform that includes reflected light pulses having pulse width $t_0$ collected by light receiving unit 115 (particularly, by pixel 142) after a time delay $t_D$ (time-of-flight). A reflected light signal waveform includes portions of reflected light pulses collected by memory element 146 (respectively by capacitor C1 and capacitor C2). A switch timing control signal waveform for switch timing control signal 150A that includes G1 switch timing control pulses for activating switch G1 (directing charge collected by photosensitive element 144 to be stored by C1), and a switch timing control signal waveform for switch timing control signal 150B that includes G2 switch timing control pulses for activating switch G2 (directing charge collected by photosensitive element 144 to be stored by C2). Both G1 switch timing control pulses and G2 switch timing control pulses have pulse width $t_0$, such that switch timing control signal 150A and switch timing control signal 150B have a same pulse width as emitted light pulses generated by light emitting unit 110. G1 switch timing control pulses are generated synchronously with the emitted light pulses at time ta and time te, while G2 switch timing control pulses are generated at time tc and time tg (where a difference between time ta and time tc and a difference between time te and time tg) is pulse width $t_0$, such that only portions of charge collected by photosensitive element 144 representative of reflected light pulses are stored by capacitor C1 and capacitor C2. FIG. 3 has been simplified for the sake of clarity to better understand the inventive concepts of the present disclosure. Additional features can be added in timing diagram 160, and some of the features described below can be replaced or eliminated in other embodiments of timing diagram 160.

For pixel 142, a distance (D) to target 105 from TOF system 100 can be determined using a ratio of reflected light signal S1 and reflected light signal S2:

$$D = \frac{1}{2} \cdot c \cdot t_0 \cdot \frac{S2}{S1 + S2}$$

where c is a speed of light, $t_0$ is a pulse width of emitted light pulses, S1 is a magnitude of reflected light signal S1 (representative of charge collected by photosensitive element 144 that is stored in capacitor C1), and S2 is a magnitude of reflected light signal S2 (representative of charge collected by photosensitive element 144 that is stored in capacitor C1). For TOF camera system 100 to infer distance accurately, TOF camera system 100 must know pulse width $t_0$ with high accuracy. Accordingly, timing generator 135 must generate accurate timing signals to control timing of emitting light pulses from light emitting unit 110, along with accurate timing signals to control timing of collecting and storing information associated with reflected light pulses by light receiving unit 115, such that pulse width $t_0$ is stable and known. Further, given numerous applications for TOF camera system 100, timing generator 135 must generate high resolution pulses (for example, having precisely defined rising edges and falling edges) with arbitrary pulse widths for such timing signals. For example, if no other sources of error exist other than pulse width error $\Delta\_t_0$, an timing error budget for achieving a distance accuracy less than or equal to about 5 mm is about 30 picoseconds (ps), meaning timing generator 135 needs to have a timing resolution less than or equal to about 30 ps.

The following discussion explores a timing generator configured to generate timing signal having high resolution pulses with arbitrary widths. The timing generator can place both rising edges and falling edges of pulses in timing signal with a resolution finer than a clock period of a reference timing signal. In some implementations, the timing generator can achieve a resolution of 30 ps for placing rising edges and/or falling edges of pulses in timing signals. The timing generator can also achieve pulse widths less than and greater than a clock period of the reference timing signal. Different embodiments may have different advantages, and no particular advantage is necessarily required of any of the embodiments described herein.

Figure 4:
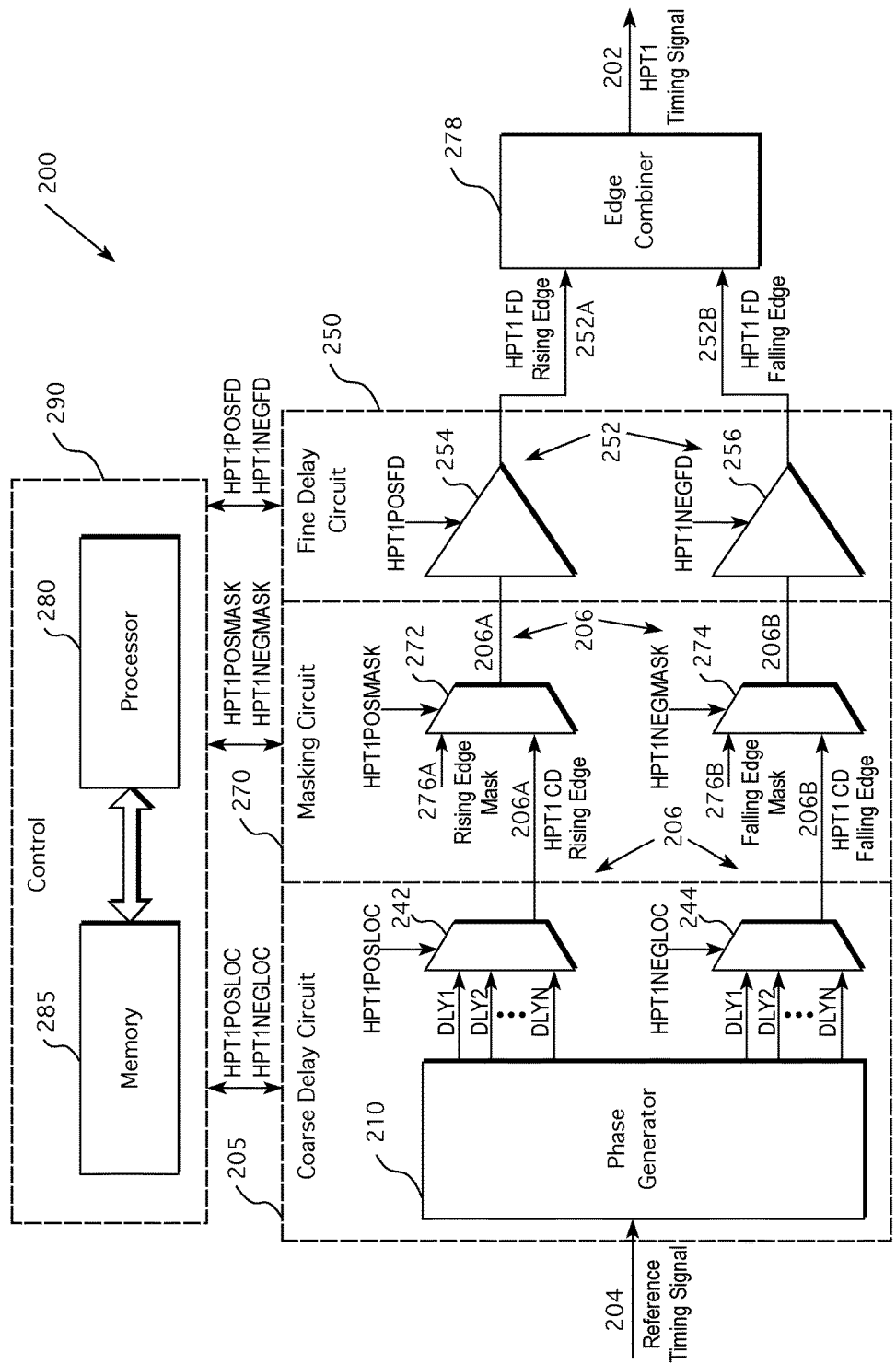
FIG. 4 depicts an exemplary timing generator, which can be implemented by the TOF system of FIG. 1, according to various aspects of the present disclosure.

FIG. 4 depicts an exemplary timing generator 200, which can be implemented as timing generator 135 by TOF system 100 of FIG. 1, according to various aspects of the present disclosure. Timing generator 200 is an electronic device (including an electronic circuit and/or one or more electronic components) configured to generate a timing signal (also referred to as a clock signal or an output signal), which can be used for synchronizing an electronic system and/or electronic circuit's operation. Timing generator 200 generates at least one timing signal, such as a timing signal 202 (HPT1 timing signal), having a phase relative to a reference timing signal 204 (also referred to as a reference clock signal or an input signal). Timing generator 200 can receive reference timing signal 204 from a clock signal source, such as a high-precision oscillator (for example, a crystal oscillator). In some implementations, reference timing signal 204 is received from a 50 MHz clock source having a clock period of about 20 nanoseconds (ns). In some implementations, when implemented in TOF system 100, timing generator 200 can generate timing signals for light emitting unit 110, light receiving unit 115, and/or analog front end 120 as described above. FIG. 4 has been simplified for the sake of clarity to better understand the inventive concepts of the present disclosure. Additional features can be added in timing generator 200, and some of the features described below can be replaced or eliminated in other embodiments of timing generator 200.

A coarse delay circuit 205 controls a coarse timing (placement) of rising edges and/or falling edges of pulses of timing signal 202. Coarse delay circuit 205 generates a coarse timing signal 206 from reference timing signal 204, where coarse timing signal 206 exhibits a resolution finer than a clock period of reference timing signal 204. Coarse timing signal 206 includes a rising edge that corresponds with a coarse delayed rising edge signal 206A (HPT1 Coarse Delayed (CD) Rising Edge Signal), which represents a rising edge of reference timing signal 204 shifted by a first coarse delay time interval, and a falling edge that corresponds with coarse delayed falling edge signal 206B (HPT1 Coarse Delayed (CD) Falling Edge Signal), which represents a rising edge of reference timing signal 204 shifted by a second coarse delay interval. Coarse delay circuit 205 can achieve a coarse resolution for timing signal 202 that is 1/Nth of a clock period of reference timing signal 204. For example, in FIG. 4, coarse delay circuit 205 includes a phase generator 210 that receives reference timing signal 204 and generates delay signals DLY1, DLY2, ... and DLYN, from which timing generator 200 selects coarse delayed rising edge signal 206A and coarse delayed falling edge signal 206B. Each delay signal DLY1-DLYN has a phase that is delayed relative to reference timing signal 204, where each delay signal DLY1-DLYN represents rising edges of reference timing signal 204 shifted (delayed) by a coarse delay time interval. In some implementations, phase generator 210 divides a clock period of reference timing signal 204 into N equal time (clock) intervals. For example, where N=128, phase generator 210 divides reference timing signal 204 into 128 clock phases, generating delay signals DLY1-DLY128. Where reference timing signal 204 has a clock period of 20 ns (for example, from a 50 MHz clock source), timing generator 200 can thus achieve placement of both rising edges and falling edges of pulses of timing signal 202 with a coarse resolution of about 156 ps (which is $\frac{1}{128}^{th}$ of the 20 ns clock period).

Figure 5:
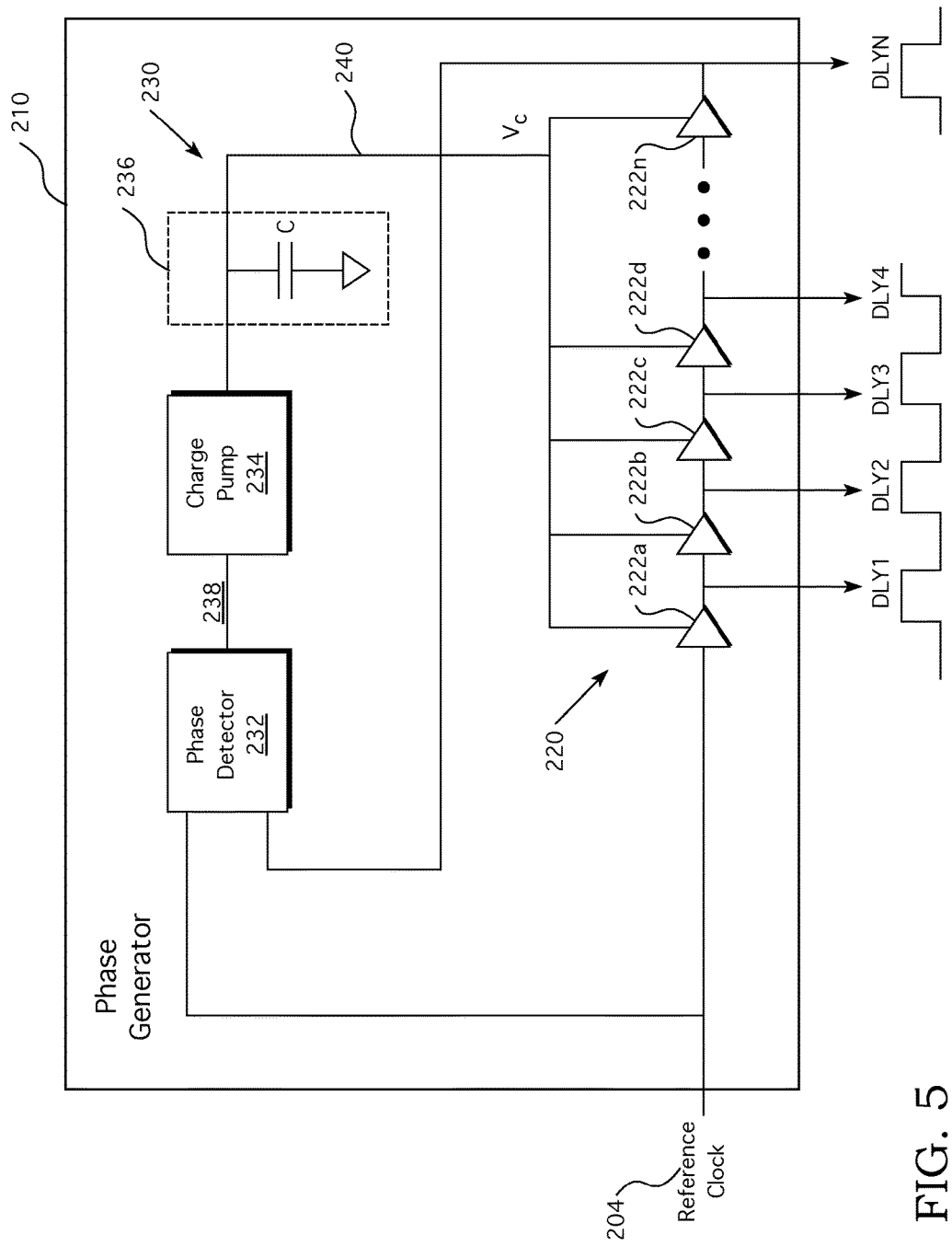
FIG. 5 depicts an exemplary phase generator, which can be implemented in the timing generator of FIG. 4, according to various aspects of the present disclosure.

FIG. 5 depicts an exemplary phase generator 210, which can be implemented in timing generator 200 of FIG. 4, according to various aspects of the present disclosure. Phase generator 210 is an electronic device (including an electronic circuit and/or one or more electronic components) configured to generate an output signal having a phase relative to an input (reference) signal. For example, phase generator 210 receives reference timing signal 204 and generates delay signals DLY1-DLYN. In FIG. 5, phase generator 210 is a delay locked loop (DLL) based phase generator. Phase generator 210 includes a voltage-controlled delay line 220 that includes delay elements 222a, 222b, 222c, 222d ... and 222n, where n is a total number of delay elements. Delay elements 222a-222n generate respective delay signals DLY1-DLYN relative to reference timing signal 204. For example, delay element 222a receives reference timing signal 204 and generates delay signal DLY1 having a phase delayed relative to reference timing signal 204, delay element 222b receives delay signal DLY1 and generates DLY2 having a phase delayed relative to delay signal DLY1, and delay elements 222c-222n receive respective delay signals DLY2-DLY(N−1) and generate respective delay signals DLY3-DLYN, each having a phase delayed relative to respective delay signals DLY2-DLY(N−1). In some implementations, delay elements 222a-222n generate about the same phase delay, where each delay signal DLY2-DLYN has a phase delay that is a multiple of a phase delay of delay signal DLY1. In some implementations, delay elements 222a-222n generate different phase delays, where each delay signal DLY2-DLYN has a phase delay that is not a multiple of a phase delay of delay signal DLY1. In some implementations, delay elements 222a-222n generate a total delay that is equal to one clock period of reference timing signal 204 (causing a total phase shift of delay elements 222a-222n that is about 360°). In some implementations, delay elements 222a-222n generate a total delay that is greater than or less than one clock period of reference timing signal 204 (causing a total phase shift of delay elements 222a-222n that is greater than or less than about 360°). FIG. 5 has been simplified for the sake of clarity to better understand the inventive concepts of the present disclosure. Additional features can be added in phase generator 210, and some of the features described below can be replaced or eliminated in other embodiments of phase generator 210.

In FIG. 5, a feedback control system 230 is a closed-loop control system that can ensure a total delay of delay elements 222a-222n (represented by delay signal DLYN) exhibits a constant phase relative to reference timing signal 204, increasing stability of delay signals DLY1-DLYN generated respectively by delay elements 222a-222n over environmental variations, such as variations in processing, temperature, supply voltage, and/or other environmental variations. Feedback control system 230 includes a phase detector 232, a charge pump 234, and a loop filter 236. Phase detector 232 responds to differences in a phase between reference timing signal 204 and a delay signal from a delay element in delay line 220, such as delay signal DLYN generated by delay element 222n, adjusting a phase of delay line 220 until the phase of delay signal DLYN matches the phase of reference timing signal 204. For example, phase detector 232 determines a phase difference between reference timing signal 204 and delay signal DLYN, and generates a control (error) signal 238 depending on the phase difference. Control signal 238 is proportional to the phase difference between reference timing signal 204 and delay signal DLYN. In an example, control signal 238 is an up control signal (such as positive voltage pulses) or a down control signal (such as negative voltage pulses) based on whether a phase of delay signal DLYN lags or leads reference timing signal 204. Based on control signal 238 received from phase detector 232, charge pump 234 and loop filter 236 (such as a low-pass filter) generate a control signal 240, which represents a control voltage ($V_c$) for delay line 220 (referred to as a coarse delay circuit control voltage). Charge pump 234 converts control signal 238 into positive or negative current pulses in proportion to the phase error, and loop filter 236 integrates the current pulses from charge pump 234 to smooth out control signal 240, for example, by removing noise and other undesirable components from control signal 238, thereby providing a stable control signal 240 to delay line 220. In the depicted embodiment, loop filter 236 includes a capacitor (C) coupled with ground and charge pump 234.

Control signal 240 desensitizes delay elements 222a-222n to variability in environmental variations, such as semiconductor processing, temperature, and/or temperature variations. Based on control signal 240, delay elements 222a-222n increase or decrease respective delay signals DLY1-DLYN by an amount proportional to the phase difference between reference timing signal 204 and delay signal DLYN determined by phase detector 232. When a phase of delay signal DLYN lags a phase of reference timing signal 204, control signal 238 generated by phase detector 232 causes charge pump 234 to drive current into loop filter 236, such that delay elements 222a-222n increase a phase of respective delay signals DLY1-DLYN based on control signal 240. When a phase of delay signal DLYN leads a phase of reference timing signal 204, control signal 238 generated by phase detector 232 causes charge pump 234 to draw current from loop filter 236, such that delay elements 222a-222n decrease a phase of respective delay signals DLY1-DLYN based on control signal 240. In some implementations, a phase of delay signal DLYN (representing a total delay of delay elements 222a-222n) is increased or decreased until a phase of delay signal DLYN is delayed about one clock period from reference timing signal 204 (for example, a phase delay of about 360° relative to reference timing signal 204). Feedback control system 230 can thus lock a total delay of delay elements 222a-222n, settling when a phase of delay signal DLYN synchronizes to a phase of reference timing signal 204 within some desired degree.

Turning back to FIG. 4, coarse delay circuit 205 selects delay signals DLY1-DLYN for generating coarse timing signal 206, such that coarse delayed rising edge signal 206A has a rising edge that correlates with a rising edge of one of delay signals DLY1-DLYN and coarse delayed falling edge signal 206B has a rising edge that correlates with a rising edge of one of delay signals DLY1-DLYN. For example, a multiplexer 242 receives delay signals DLY1-DLYN and selects one of delay signals DLY1-DLYN for coarse delayed rising edge signal 206A, and a multiplexer 244 receives delay signals DLY1-DLYN and selects one of delay signals DLY1-DLYN for coarse delayed falling edge signal 206B. In some implementations, multiplexer 242 and multiplexer 244 are each an N:1 multiplexer. In implementations where N=128, multiplexers 242 and multiplexer 244 are 128:1 multiplexers, where multiplexer 242 selects one of delay signals DLY1-DLY128 for coarse delayed rising edge signal 206A and multiplexer 244 selects one of delay signals DLY1-DLY128 for coarse delayed falling edge signal 206B. Multiplexer 242 and multiplexer 244 select which delay signals DLY1-DLYN are used to respectively generate coarse delayed rising edge signal 206A and coarse delayed falling edge signal 206B based on control signals, such as programmable rising edge location signal HPT1POSLOC and programmable falling edge location signal HPT1NEGLOC.

A fine delay circuit 250 controls a fine timing (placement) of rising edges and/or falling edges of pulses of timing signal 202. Fine delay circuit 250 shifts rising edges of coarse timing signal 206 by a fine delay interval (increment), generating a fine timing signal 252 having a finer resolution than coarse timing signal 206. Fine timing signal 252 includes a fine delayed rising edge signal 252A (HPT1 Fine Delayed (CD) Rising Edge Signal), which represents coarse delayed rising edge signal 206 shifted by a fine delay time interval, and a fine delayed falling edge signal 252B (HPT1 Fine Delayed (CD) Falling Edge Signal), which represents coarse delayed falling edge signal 206 shifted by a fine delay interval. In FIG. 4, fine delay circuit 250 includes a fine delay rising edge element 254 that generates fine delayed rising edge signal 252A by shifting coarse delayed rising edge signal 206A by a programmable fine delay interval, and a fine delay falling edge element 256 that generates fine delayed falling edge signal 252B by shifting coarse delayed falling edge signal 206B by a programmable fine delay interval. In some implementations, fine delay rising edge element 254 and fine delay falling edge element 256 can respectively shift coarse delayed rising edge signal 206A and coarse delayed falling edge signal 206B by 30 ps time increments. Fine delay rising edge element 254 and fine delay falling edge element 256 select a delay amount based on respective control signals, such as a programmable rising edge fine delay control signal HPT1POSFD and a programmable falling edge fine delay control signal HPT1NEGFD. In some implementations, rising edge fine delay control signal HPT1POSFD and falling edge fine delay control signal HPT1NEGFD have a number of bits equal to a number of fine delay stages respectively of fine delay rising edge element 254 and fine delay falling edge element 256. For example, where fine delay rising edge element 254 and fine delay falling edge element 256 each include three fine delay stages (as described further below), rising edge fine delay control signal HPT1POSFD and falling edge fine delay control signal HPT1NEGFD represent three-bit control signals.

Figure 6:
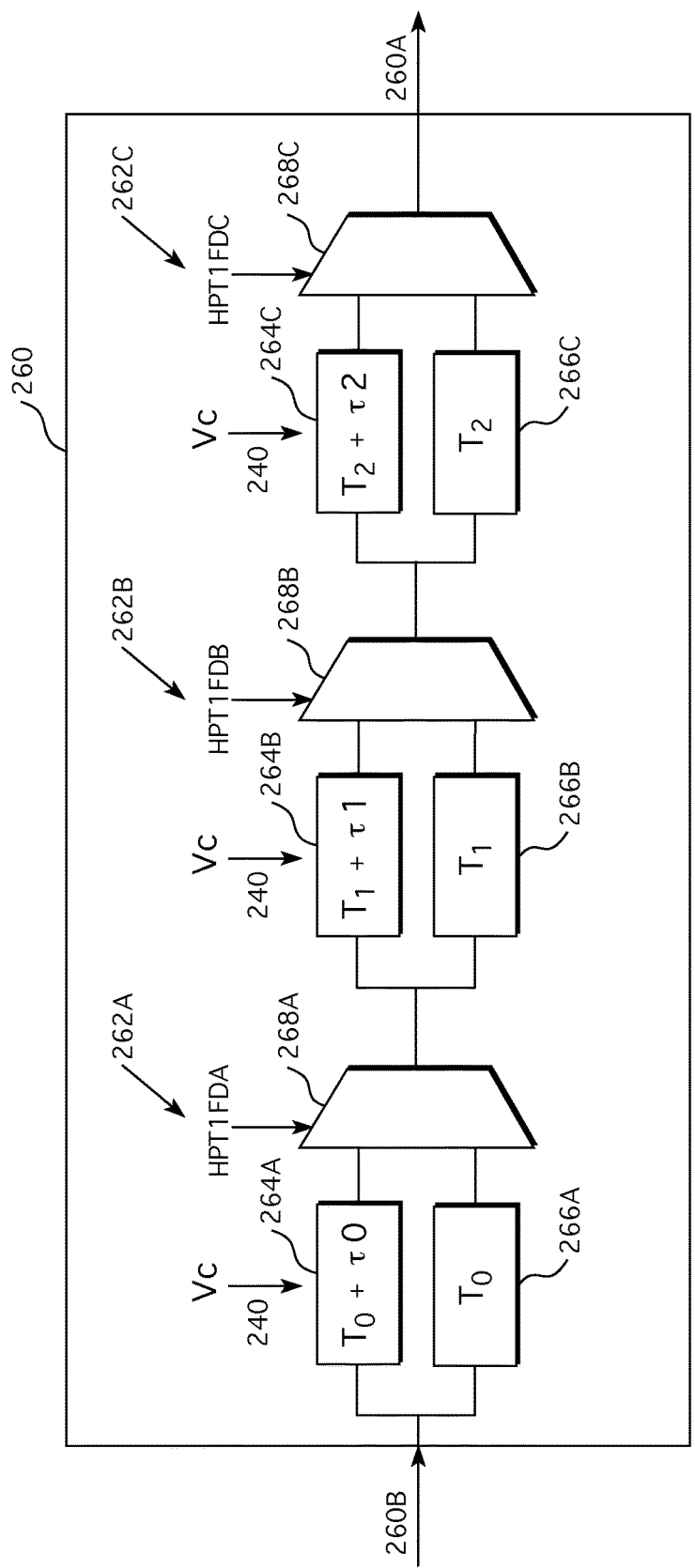
FIG. 6 depicts an exemplary fine delay edge buffer, which can be implemented in the timing generator of FIG. 4, according to various aspects of the present disclosure.

FIG. 6 depicts an exemplary fine delay edge buffer 260, which can be implemented as fine delay rising edge element 254 and/or fine delay falling edge element 256 of timing generator 200 of FIG. 4, according to various aspects of the present disclosure. Fine delay edge buffer 260 is an electronic device (including an electronic circuit and/or one or more electronic components) configured to generate a fine delayed signal 260A (such as fine delayed rising edge signal 252A or fine delayed falling edge signal 252B) by shifting coarse delayed signal 260B (such as coarse delayed rising edge signal 206A or coarse delayed falling edge signal 206B) by selected fine delay intervals. Fine delay edge buffer 260 includes various fine delay stages (cells) cascaded in series, such as a fine delay stage 262A, a fine delay stage 262B, and a fine delay stage 262C connected in series. Each fine delay stage includes two delay paths and selection circuitry for selecting coarse delayed signal 260B from one of the two delay paths: a first delay path configured to shift (delay) edges of coarse delayed signal 260B by a fine delay increment, and a second delay path configured to pass coarse delayed signal 260B without any additional delay (other than delay inherently introduced to coarse delayed signal 260B from traversing the fine delay stage). For example, fine delay stage 262A includes a delay path 264A for delaying edges of coarse delayed signal 260B by a fine delay increment τ0 and a delay path 266A for passing coarse delayed signal 260B without any additional delay (other than delay inherently introduced to coarse delayed signal 260B from traversing fine delay stage 262A); fine delay stage 262B includes a delay path 264B for delaying edges of coarse delayed signal 260B by a fine delay increment τ1 and a delay path 266B for passing coarse delayed signal 260B without any additional delay (other than delay inherently introduced to coarse delayed signal 260B from traversing fine delay stage 262B); and fine delay stage 262C includes a delay path 264C for delaying edges of coarse delayed signal 260B by a fine delay increment τ2 and a delay path 266C for passing coarse delayed signal 260B without any additional delay (other than delay inherently introduced to coarse delayed signal 260B from traversing the fine delay stage). Fine delay stage 262A, fine delay stage 262B, and fine delay stage 262C respectively include a multiplexer 268A, a multiplexer 268B, and a multiplexer 268C. In some implementations, multiplexer 268A, multiplexer 268B, and multiplexer 268C are 2:1 multiplexers. Multiplexer 268A selects delay path 264A or delay path 266A for coarse delayed signal 260B based on fine delay control signal HPT1FDA, such that coarse delayed signal 260B exhibits delay $T_0+\tau 0$ or delay $T_0$ after traversing fine delay stage 262A. Multiplexer 268B selects delay path 264B or delay path 266B for coarse delayed signal 260B based on fine delay control signal HPT1FDB, such that coarse delayed signal 260B exhibits delay $T_1+\tau 1$ or delay $T_1$ after traversing fine delay stage 262B. Multiplexer 268C selects delay path 264C or delay path 266C for coarse delayed signal 260B based on fine delay control signal HPT1FDC, such that coarse delayed signal 260B exhibits delay $T_2+\tau 2$ or delay $T_2$ after traversing fine delay stage 262C. Fine delay control signal HPT1FDA, fine delay control signal HPT1FDB, and fine delay control signal HPT1FDC collectively represent a programmable three-bit fine delay control signal HPT1FD that controls delay introduced to coarse delayed signal 260B. In some implementations, the second delay path (here, delay path 266A, delay path 266B, and/or delay path 266C) can also be configured to shift edges of coarse delayed signal 260B by a fine delay increment that is different from the first delay path (here, delay path 264A, delay path 264B, and/or delay path 264C). FIG. 6 has been simplified for the sake of clarity to better understand the inventive concepts of the present disclosure. Additional features can be added in fine delay edge buffer 260, and some of the features described below can be replaced or eliminated in other embodiments of fine delay edge buffer 260.

Each delay stage applies a greater fine delay increment than previous stages, such that a fine delay may be progressively increased as coarse delayed signal 260B passes traverses fine delay edge buffer 260. For example, fine delay increment $\tau 2$ is greater than fine delay increment $\tau 1$, and fine delay increment $\tau 1$ is greater than fine delay increment $\tau 0$. Delays greater than fine delay increment $\tau 0$ (provided by fine delay stage 262A), such as fine delay increment $\tau 1$ (provided by fine delay stage 262B) and fine delay increment $\tau 2$ (provided by fine delay stage 262C), are achieved by using a difference in delay between fine delay stages. Alternatively, each delay stage applies a same fine delay increment (for example, $\tau 1=\tau 2=\tau 3$). In operation, when fine delay stage 262A receives coarse delayed signal 260B (such as coarse delayed rising edge signal 206A or coarse delayed falling edge signal 206B), coarse delayed signal 260B includes edges shifted by a coarse delay T relative to reference timing signal 204. Coarse delayed signal 260B then traverses delay path 264A, which shifts edges of coarse delayed signal 260B by fine delay increment $\tau 0$ (placing edges of coarse delayed signal 260B at $T_0+\tau 0$), or delay path 266A, which shifts edges of coarse delayed signal 260B by $T_0$ (an inherent delay of coarse delayed signal 260B traversing fine delay stage 262A). Multiplexer 268A selects a delay $T_A$ applied to coarse delay signal 260B, selecting delay path 264A ($T_A=T_0+\tau 0$) or delay path 266A ($T_A=T_0$) for coarse delayed signal 260B. When fine delay stage 262B receives coarse delayed signal 260B, coarse delayed signal 260B includes edges shifted by time interval $T_A$ relative to reference timing signal 204. Coarse delayed signal 260B then traverses delay path 264B, which shifts edges of coarse delayed signal 260B by fine delay increment $\tau 1$ (placing edges of coarse delayed signal 260B at $T_1+\tau 1$), or delay path 266B, which shifts edges of coarse delayed signal 260B by $T_1$ (an inherent delay of coarse delayed signal 260B traversing fine delay stage 262B). Multiplexer 268B selects a delay $T_B$ applied to coarse delay signal 260B, selecting delay path 264A ($T_B=T_1+\tau 1$) or delay path 266A ($T_B=T_1$) for coarse delayed signal 260B. When fine delay stage 262C receives coarse delayed signal 260B, coarse delayed signal 260B includes edges shifted by time interval $T_B$ relative to reference timing signal 204. Coarse delayed signal 260B then traverses delay path 264C, which shifts edges of coarse delayed signal 260B by fine delay increment $\tau 2$ (placing edges of coarse delayed signal 260B at $T_2+\tau 2$), or delay path 266C, which shifts edges of coarse delayed signal 260B by $T_2$ (an inherent delay of coarse delayed signal 260B traversing fine delay stage 262C). Multiplexer 268C selects a time interval $T_C$ applied to coarse delay signal 260B, selecting delay path 264C ($T_C=T_2+\tau 2$) or delay path 266C ($T_C=T_2$) for coarse delayed signal 260B. Further, since fine delay edge buffer 260 is susceptible to processing, temperature, supply voltage, and/or other environmental variations as an open-loop system, control signal 240 (which represents the coarse delay circuit control voltage ($V_c$) set by feedback control system 230 in coarse delay circuit 205) can be applied to fine delay stage 262A, fine delay stage 262B, and fine delay stage 262C, particularly to delay path 264A, delay path 264B, and delay path 264C. A delay difference associated with fine delay stage 262A, fine delay stage 262B, and fine delay stage 262C thus becomes a function of control signal 240. Applying control signal 240 to fine delay stages 262A, 262B, and 262C desensitizes fine delay increments (here, $\tau 0$, $\tau 1$, and $\tau 2$) to the environmental variations.

Fine delay edge buffer 260 can thus generate fine delayed signal 260A (such as fine delayed rising edge signal 252A or fine delayed falling edge signal 252B) by selecting one of eight different fine delay amounts for shifting (delaying) edges of coarse delayed signal 260B: 0, $\tau 0$, $\tau 1$, $\tau 0+\tau 1$, $\tau 2$, $\tau 0+\tau 2$, $\tau 1+\tau 2$, or $\tau 0+\tau 1+\tau 2$ depending on states of fine delay stage 262A, fine delay stage 262B, and fine delay stage 262C as defined by fine delay control signals HPT1FDA, HPT1FDB, and HPT1FDC (collectively representative of rising edge fine delay control signal HPT1POSFD or falling edge fine delay control signal HPT1NEGFD). In some implementations, fine delay edge buffer 260 achieves 30 ps fine delay intervals. For example, where $\tau 0=30$ ps, $\tau 1=60$ ps, and $\tau 2=120$ ps, fine delay edge buffer 260 can delay edges of coarse delayed signal 260B by 0 ps, 30 ps, 60 ps, 90 ps, 120 ps, 150 ps, 180 ps, or 210 ps. In some implementations, fine delay edge buffer 260 is configured with a maximum fine delay interval (for example, $\tau 0+\tau 1+\tau 2$) that is less than a coarse delay interval achieved by coarse delay circuit 205. In some implementations, fine delay edge buffer 260 is configured with a maximum fine delay interval that is greater than a coarse delay interval achieved by coarse delay circuit 205. For example, where coarse delay circuit 205 can shift edges of reference signal 204 by a coarse delay interval of about 156 ps (such as described above) and fine delay edge buffer 260 implements fine delay intervals of $\tau 0=30$ ps, $\tau 1=60$ ps, and $\tau 2=120$ ps, fine delay edge buffer 260 can shift edges of coarse delayed signal 260B by as much as 210 ps (the maximum fine delay interval). In such implementations, fine delay edge buffer 260 is configured to have a maximum fine delay interval that overlaps the coarse delay interval of coarse delay circuit 205. By having a maximum fine delay interval that overlaps the coarse delay interval of coarse delay circuit 205, fine edge delay buffer 260 (and thus fine delay circuit 250) can be used to calibrate coarse delay circuit 205, compensating for any mismatches that arise between coarse delay intervals generated by coarse delay circuit 205.

Figure 7:
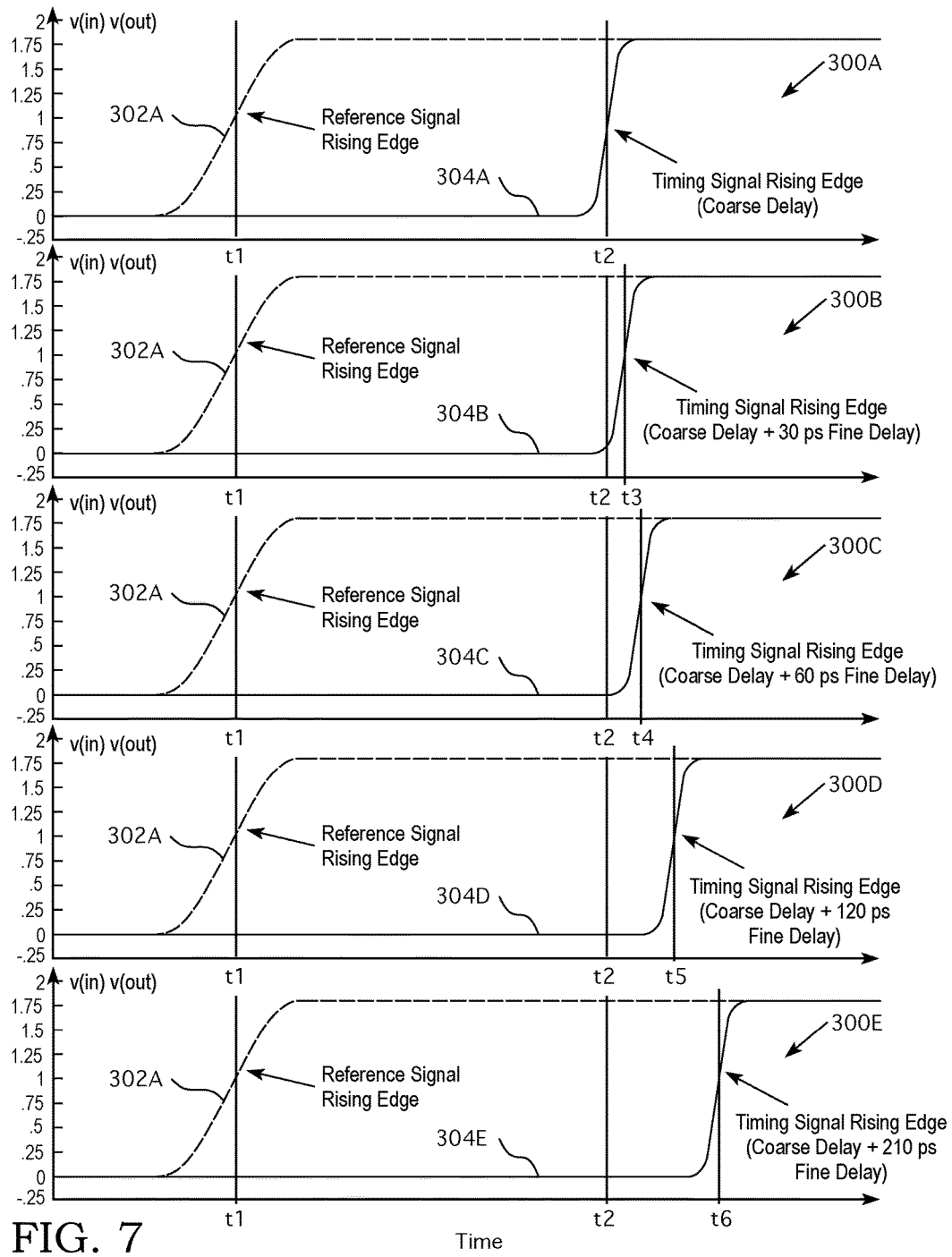
FIG. 7 includes timing diagrams that illustrate a placement of edges of a timing signal relative to a reference timing signal by a timing generator having a fine delay circuit, such as the timing generator of FIG. 4, according to various aspects of the present disclosure.

FIG. 7 includes timing diagrams that illustrate a placement of edges of a timing signal relative to a reference timing signal by a timing generator having a fine delay circuit, such as fine delay circuit 250 of timing generator 200 of FIG. 4, according to various aspects of the present disclosure. A timing diagram 300A, a timing diagram 300B, a timing diagram 300C, a timing diagram 300D, and a timing diagram 300E illustrate placement of rising edges of timing signal 202 relative to reference timing signal 204 based on fine delay settings employed by timing generator 200 to fine delay rising edge element 254 (which is configured as fine delay edge buffer 260). Each waveform oscillates between a high voltage signal (high output) and a low voltage signal (low output). Timing diagram 300A, timing diagram 300B, timing diagram 300C, timing diagram 300D, and timing diagram 300E each include a reference timing signal waveform 302A for reference timing signal 204, where reference timing signal 204 has a rising edge that occurs at a time t1. FIG. 7 has been simplified for the sake of clarity to better understand the inventive concepts of the present disclosure. Additional features can be added in timing diagrams 300A-300E, and some of the features described below can be replaced or eliminated in other embodiments of timing diagrams 300A-300E.

Timing diagram 300A illustrates placement of a rising edge of timing signal 202 when timing generator 200 delays reference timing signal 204 by a coarse delay increment without any fine delay. For example, a timing signal waveform 304A illustrates timing signal 202 coarsely delayed relative to reference timing signal 204, where a rising edge of timing signal 202 is shifted from time t1 to a time t2. In this scenario, timing generator 200 adds no fine delay increments (here, τ0, τ1, and τ2) to reference timing signal 204 by selecting the coarse delayed signal from delay path 266A, delay path 266B, and delay path 266C based on fine delay control signal HPT1FD (for example, by turning fine delay stage 262A, fine delay stage 262B, and fine delay stage 262C off). Timing diagram 300B illustrates placement of a rising edge of timing signal 202 when timing generator 200 delays reference timing signal 204 by the coarse delay increment and fine delay increment τ0 (for example, about 30 ps). For example, a timing signal waveform 304B illustrates timing signal 202 coarsely and finely delayed relative to reference timing signal 204, where a rising edge of timing signal 202 is further shifted from time t2 by fine delay increment τ0 to a time t3. In this scenario, timing generator 200 adds fine delay increment τ0 by selecting delay path 264A, delay path 266B, and delay path 266C based on fine delay control signal HPT1FD (for example, by turning fine delay stage 262A on by setting a least significant bit of fine delay control signal HPT1FD to an active state). Timing diagram 300C illustrates placement of a rising edge of timing signal 202 when timing generator 200 delays reference timing signal 204 by the coarse delay increment and fine delay increment τ1 (for example, about 60 ps). For example, a timing signal waveform 304C illustrates timing signal 202 coarsely and finely delayed relative to reference timing signal 204, where a rising edge of timing signal 202 is further shifted from time t2 by fine delay increment τ1 to a time t4. In this scenario, timing generator 200 adds fine delay increment τ1 by selecting delay path 266A, delay path 264B, and delay path 266C based on fine delay control signal HPT1FD (for example, by turning fine delay stage 262B on by setting an intermediate bit of fine delay control signal HPT1FD to an active state). Timing diagram 300D illustrates placement of a rising edge of timing signal 202 when timing generator 200 delays reference timing signal 204 by the coarse delay increment and fine delay increment τ2 (for example, about 120 ps). For example, a timing signal waveform 304D illustrates timing signal 202 coarsely and finely delayed relative to reference timing signal 204, where a rising edge of timing signal 202 is further shifted from time t2 by fine delay increment τ2 to a time t5. In this scenario, timing generator 200 adds fine delay increment τ2 by selecting delay path 266A, delay path 266B, and delay path 264C based on edge fine delay control signal HPT1FD (for example, by turning fine delay stage 262C on by setting a most significant bit of fine delay control signal HPT1FD to an active state). Timing diagram 300E illustrates placement of a rising edge of timing signal 202 when timing generator 200 delays reference timing signal 204 by the coarse delay increment and fine delay increments τ0, τ1, and τ2 (for example, about 210 ps). For example, a timing signal waveform 304E illustrates timing signal 202 coarsely and finely delayed relative to reference timing signal 204, where a rising edge of timing signal 202 is shifted from time t2 by fine delay increment τ0+τ1+τ2 to a time t6. In this scenario, timing generator 200 adds fine delay increments τ0, τ1, and τ2 by selecting delay path 264A, delay path 264B, and delay path 264C based on edge fine delay control signal HPT1FD (for example, by turning fine delay stage 262A, fine delay stage 262B, and fine delay stage 262C on by setting all bits of fine delay control signal HPT1FD to an active state). Though the above example indicates that fine delay stage 262A is controlled by a least significant bit of fine delay control signal HPT1FD, fine delay stage 262B is controlled by an intermediate bit of fine delay control signal HPT1FD, and fine delay stage 262C is controlled by a most significant bit of fine delay control signal HPT1FD, the present disclosure contemplates controlling fine delay stage 262A, fine delay stage 262B, and fine delay stage 262C using any bit order of fine delay control signal HPT1FD.

Figure 8A:
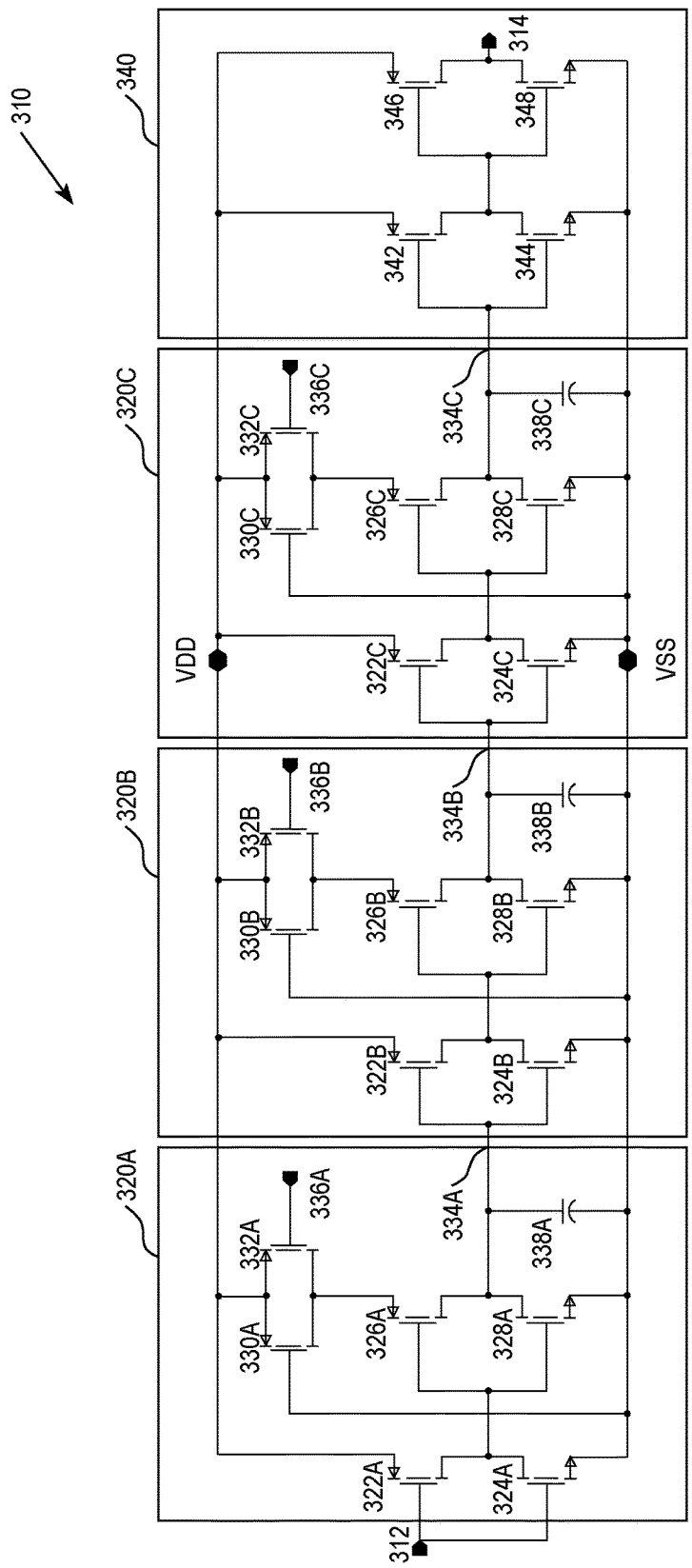
FIG. 8A is a transistor level diagram of an exemplary fine delay edge circuit, which can be implemented as the fine delay edge buffer of FIG. 6, according to various aspects of the present disclosure.
Figure 8B:
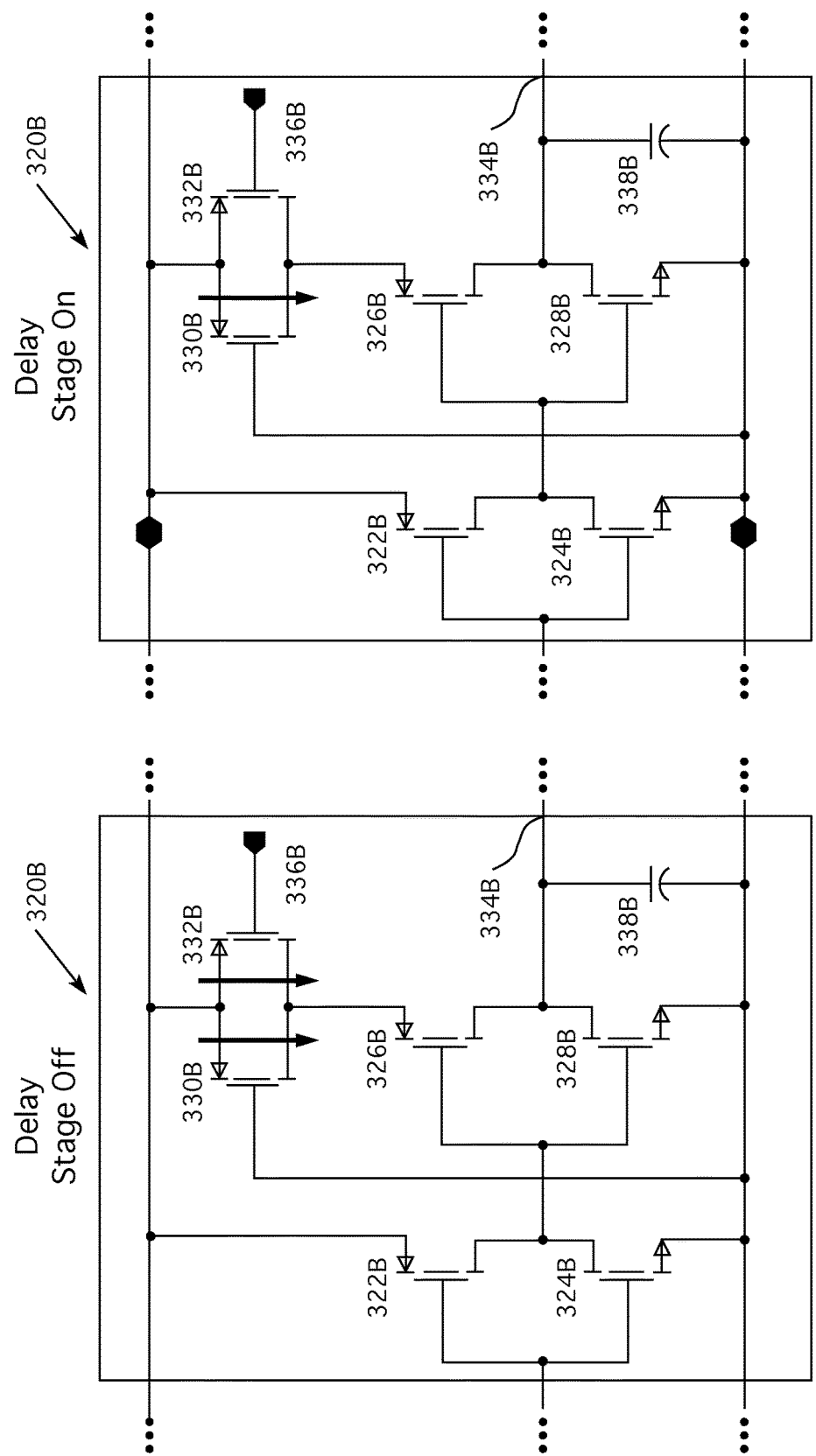
FIG. 8B is a portion of fine delay edge circuit, particularly a fine delay stage of the fine delay edge circuit, during different operating states according to various aspects of the present disclosure.

FIG. 8A is a transistor level diagram of an exemplary fine delay edge circuit 310, which can be implemented as fine delay edge buffer 260 of FIG. 6, according to various aspects of the present disclosure; and FIG. 8B is a portion of fine delay edge circuit 310, particularly a second fine delay stage of fine delay edge circuit 310, during different operating states according to various aspects of the present disclosure. Fine delay edge circuit 310 is an electronic device (including an electronic circuit and/or one or more electronic components) configured to receive a coarse delayed signal (such as coarse delayed signal 260B) at an input node 312 and generate a fine delayed signal (such as fine delayed signal 260A) at an output node 312 by delaying rising edges and/or falling edges of the coarse delayed signal by selected fine delay intervals. Fine delay edge circuit 310 includes various fine delay stages (cells) connected in series, such as a fine delay stage 320A, a fine delay stage 320B, and a fine delay stage 320C connected in series. FIG. 8A and FIG. 8B have been simplified for the sake of clarity to better understand the inventive concepts of the present disclosure. Additional features can be added in fine delay edge circuit 310, and some of the features described below can be replaced or eliminated in other embodiments of fine delay edge circuit 310.

Fine delay stage 320A includes a buffer that includes two complementary metal-oxide-semiconductor (CMOS) transistors: a first CMOS transistor having a p-type transistor 322A and an n-type transistor 324A, and a second CMOS transistor having a p-type transistor 326A and an n-type transistor 328A. P-type transistor 322A and n-type transistor 324A have gate terminals coupled with input node 312 (which receives the coarse delayed signal having a delay T)

and drain terminals coupled with gate terminals of the second CMOS transistor (particularly, p-type transistor 326A and n-type transistor 328A). P-type transistor 322A has a source terminal coupled with a supply voltage VDD of fine delay edge circuit 310, and n-type transistor 324A has a source terminal coupled with a supply voltage VSS of fine delay edge circuit 310. P-type transistor 326A and n-type transistor 328A have drain terminals coupled with an output node 334A of fine delay stage 320A. P-type transistor 326A has a source terminal coupled with drain terminals of a p-type transistor 330A and a p-type transistor 332A, and n-type transistor 328A has a source terminal coupled with supply voltage VSS. P-type transistor 330A and p-type transistor 332A have source terminals coupled with supply voltage VDD. P-type transistor 330A has a gate terminal coupled with supply voltage VSS, and p-type transistor 332A has a gate terminal coupled with a bias voltage terminal 336A (at which fine delay control signal HPT1FDA is applied), which controls a state of p-type transistor 332A. When fine delay control signal HPT1FDA is in an inactive state (for example, a LOW output, such as a digital zero), p-type transistor 332A is in an on state, allowing charging current to flow in p-type transistor 332A. When fine delay control signal HPT1FDA is in an active state (for example, a HIGH output, such as a digital one), p-type transistor 332A is in an off state, preventing charging current from flowing in p-type transistor 332A. Fine delay stage 320A generates the coarse delayed signal having a delay $T_A$, where $T_A=T_0$ (for example, inherent delay introduced to the coarse delayed signal from traversing fine delay stage 320A) when p-type transistor 332A is in the on state and $T_A=T_0+\tau 0$ (for example, about 30 ps) when p-type transistor 332A is in an off state. A capacitor 338A is coupled with output node 334A and supply voltage VSS.

Fine delay stage 320B includes a buffer that includes two CMOS transistors: a first CMOS transistor having a p-type transistor 322B and an n-type transistor 324B, and a second CMOS transistor having a p-type transistor 326B and an n-type transistor 328B. P-type transistor 322B and n-type transistor 324B have gate terminals coupled with output node 334A (which receives the coarse delayed signal having delay $T_1$) and drain terminals coupled with gate terminals of the second CMOS transistor (particularly, p-type transistor 326B and n-type transistor 328B). P-type transistor 322B has a source terminal coupled with a supply voltage VDD of fine delay edge circuit 310, and n-type transistor 324B has a source terminal coupled with a supply voltage VSS of fine delay edge circuit 310. P-type transistor 326B and n-type transistor 328B have drain terminals coupled with an output node 334B of fine delay stage 320B. P-type transistor 326B has a source terminal coupled with drain terminals of a p-type transistor 330B and a p-type transistor 332B, and n-type transistor 328B has a source terminal coupled with supply voltage VSS. P-type transistor 330B and p-type transistor 332B have source terminals coupled with supply voltage VDD. P-type transistor 330B has a gate terminal coupled with supply voltage VSS, and p-type transistor 332B has a gate terminal coupled with a bias voltage terminal 336B (at which fine delay control signal HPT1FDB is applied), which controls a state of p-type transistor 332B. FIG. 8B depicts fine delay stage 320B when fine delay control signal HPT1FDB is in an inactive state and an active state. When fine delay control signal HPT1FDB is in an inactive state (set to LO output), p-type transistor 332B is in an on state, allowing charging current to flow in both p-type transistor 330B and p-type transistor 332B. Fine delay stage 320B is thus turned off, generating the coarse delayed signal with a delay $T_B$, where $T_B=T_A+T_1$ (inherent delay introduced to the coarse delayed signal from traversing fine delay stage 320B). When fine delay control signal HPT1FDB is in an active state (set to HIGH output), p-type transistor 332B is in an off state, allowing charging current to flow only in p-type transistor 330B. By turning off p-type transistor 332B, a delay through fine delay stage 320B is increased by a controlled amount (fine delay increment $\tau 1$). Fine delay stage 320B is thus turned on, generating the coarse delayed signal having delay $T_B=T_1+\tau 1$ (for example, about 60 ps). A capacitor 338B is coupled with output node 334B and supply voltage VSS.

Fine delay stage 320C includes a buffer that includes two CMOS transistors: a first CMOS transistor having a p-type transistor 322C and an n-type transistor 324C, and a second CMOS transistor having a p-type transistor 326C and an n-type transistor 328C. P-type transistor 322C and n-type transistor 324C have gate terminals coupled with output node 334B (which receives the coarse delayed signal having delay $T_2$) and drain terminals coupled with gate terminals of the second CMOS transistor (particularly, p-type transistor 326C and n-type transistor 328C). P-type transistor 322C has a source terminal coupled with a supply voltage VDD of fine delay edge circuit 310, and n-type transistor 324C has a source terminal coupled with a supply voltage VSS of fine delay edge circuit 310. P-type transistor 326C and n-type transistor 328C have drain terminals coupled with an output node 334C of fine delay stage 320C. P-type transistor 326C has a source terminal coupled with drain terminals of a p-type transistor 330C and a p-type transistor 332C, and n-type transistor 328C has a source terminal coupled with supply voltage VSS. P-type transistor 330C and p-type transistor 332C have source terminals coupled with supply voltage VDD. P-type transistor 330C has a gate terminal coupled with supply voltage VSS, and p-type transistor 332C has a gate terminal coupled with a bias voltage terminal 336C (at which fine delay control signal HPT1FDC is applied), which controls a state of p-type transistor 332C. When fine delay control signal HPT1FDC is in an inactive state, p-type transistor 332C is in an on state, allowing charging current to flow in p-type transistor 332C. When fine delay control signal HPT1FDC is in an active state, p-type transistor 332C is in an off state, preventing charging current from flowing in p-type transistor 332C. Fine delay stage 320C generates the coarse delayed signal having a delay $T_C$, where $T_C=T_B+T_2$ (for example, inherent delay introduced to the coarse delayed signal from traversing fine delay stage 320A) when p-type transistor 332C is in the on state and $T_C=T_B+\tau 3$ (for example, about 120 ps) when p-type transistor 332C is in an off state. A capacitor 338C is coupled with output node 334C and supply voltage VSS.

Fine delay edge circuit 310 can further include a buffer stage 340 having two CMOS transistors: a first CMOS transistor having a p-type transistor 342 and an n-type transistor 344, and a second CMOS transistor having a p-type transistor 346 and an n-type transistor 348. P-type transistor 342 and n-type transistor 344 have gate terminals coupled with output node 334C (which receives the coarse delayed signal having delay $T_3$) and drain terminals coupled with the second CMOS transistor (specifically gate terminals of p-type transistor 346 and n-type transistor 348). P-type transistor 346 and n-type transistor 348 have drain terminals coupled with output node 314. P-type transistor 342 and p-type transistor 346 have source terminals coupled with supply voltage VDD, and n-type transistor 344 and n-type transistor 348 have source terminals coupled with supply voltage VSS.

Turning again to FIG. 4, a masking circuit 270 controls a width of pulses of coarse timing signal 206, allowing timing generator 200 to generate pulses of timing signal 202 having arbitrary widths. For example, masking circuit 270 controls a clock period in which rising edges and/or falling edges of coarse timing signal 202 are coarsely timed (placed). Masking circuit 270 separately masks rising edges and falling edges of coarse timing signal 206, passing coarse delayed rising edge signal 206A and coarse delayed falling edge signal 206B to fine delay circuit 250 based respectively on rising edge mask control signal HPT1POSMASK and falling edge mask control signal HPT1NEGMASK. Separately masking coarse delayed rising edge signal 206A and coarse delayed falling edge signal 206B allows timing generator 200 to create pulses having widths larger than a clock period of reference timing signal 204, such as a pulse that starts in one clock period of reference timing signal 204 and finishes in another clock period of reference timing signal 204 several clock cycles away. A rising edge masking circuit 272 masks coarse delayed rising edge signal 206A based on rising edge mask control signal HPT1POSMASK, and a falling edge masking circuit 274 masks coarse delayed falling edge signal 206B based on falling edge mask control signal HPT1NEGMASK. In FIG. 4, rising edge masking circuit 272 is depicted as a multiplexer that receives a rising edge mask signal 276A and coarse delayed rising edge signal 206A, and falling edge masking circuit 274 is depicted as a multiplexer that receives a falling edge mask signal 276B and coarse delayed falling edge signal 206B. Rising edge masking circuit 272 passes coarse delayed rising edge signal 206A to fine delay rising edge element 254 when rising edge mask control signal HPT1POSMASK is in an inactive state, and falling edge masking circuit 274 passes coarse delayed falling edge signal 206B to fine delay falling edge element 256 when falling edge mask control signal HPT1NEGMASK is in an inactive state.

In the depicted embodiment, timing generator 200 is configured with masking circuit 260 between fine delay circuit 250 and coarse delay circuit 205. However, the present disclosure contemplates implementations, where fine delay circuit 250 is configured between coarse delay circuit 205 and making circuit 270. In such implementations, masking circuit 270 separately masks fine delayed rising edge signal 252A and fine delayed falling edge signal 252B, passing fine delayed rising edge signal 252A and fine delayed falling edge signal 252B to edge combiner 278 based respectively on rising edge mask control signal HPT1POSMASK and falling edge mask control signal HPT1NEGMASK. Separately masking rising edges and falling edges of fine timing signal 252 allows timing generator 200 to create pulses having widths larger than a clock period of reference timing signal 204, such as a pulse that starts in one clock period of reference timing signal 204 and finishes in another clock period of reference timing signal 204 several clock cycles away. In such implementations, rising edge masking circuit 272 masks rising edges of fine timing signal 252 (for example, by masking fine delayed rising edge signal 206B) based on rising edge mask control signal HPT1POSMASK, and falling edge masking circuit 274 masks falling edges of fine timing signal 252 (for example, by masking fine delayed falling edge signal 252B) based on falling edge mask control signal HPT1NEGMASK. For example, a multiplexer can receive rising edge mask signal 276A and fine delayed rising edge signal 252A, and a multiplexer can receive falling edge mask signal 276B and coarse delayed falling edge signal 206C, where rising edge masking circuit 272 passes fine delayed rising edge signal 252A to edge combiner 278 when rising edge mask control signal HPT1POSMASK is in an inactive state, and falling edge masking circuit 274 passes fine delayed falling edge signal 252B to edge combiner 278 when falling edge mask control signal HPT1NEGMASK is in an inactive state.

Timing generator 200 generates rising edge mask control signal HPT1POSMASK and falling edge mask control signal HPT1NEGMASK at a coarse resolution, for example, at about a clock period of reference timing signal 204. For example, where reference timing signal 204 has a clock period of 20 ns, timing generator 200 generates rising edge mask control signal HPT1POSMASK and falling edge mask control signal HPT1NEGMASK about every 20 ns, such that rising edge mask control signal HPT1POSMASK and falling edge mask control signal HPT1NEGMASK remain in an active state or an inactive state for about 20 ns. In some implementations, timing generator 200 generates a high voltage signal (HIGH output), such as a digital one, when setting rising edge mask control signal HPT1POSMASK and falling edge mask control signal HPT1NEGMASK in the active state and a low voltage signal (LOW output), such as a digital zero, when setting rising edge mask control signal HPT1POSMASK and falling edge mask control signal HPT1NEGMASK in the inactive state. Timing generator 200 thus exhibits three levels of resolution: a coarse timing (for example, about 156 ps), a fine timing (for example, about 30 ps), and a masking timing (for example, about 20 ns). Without the pulse generation flexibility provided by masking circuit 270, timing generator 200 will generate periodic timing signals having repeating pulses.

FIGS. 9A-9D are timing diagrams that illustrate states of various signals of a timing generator, such as timing generator 200 of FIG. 4, when implementing a masking circuit, such as masking circuit 270, according to various aspects of the present disclosure. In FIGS. 9A-9D, a timing diagram 350A, a timing diagram 350C, a timing diagram 350C, and a timing diagram 350D each include a reference signal waveform 352 that illustrates reference timing signal 204 over time, a coarse delayed rising edge signal waveform 354 that illustrates coarse delayed rising edge signal 206A (here, HPT1 CD Rising Edge Signal) over time, a coarse delayed falling edge signal waveform 356 that illustrates coarse delayed falling edge signal 206A (here, HPT1 CD Falling Edge Signal) over time, a rising edge mask control signal waveform 358 that illustrates rising edge mask control signal (here, HPT1POSMASK) over time, a falling edge mask control signal waveform 360 that illustrates falling edge mask control signal (here, HPT1NEGMASK) over time, and a timing signal waveform 362 that illustrates timing signal 202 (here, HPT1 Timing Signal) over time. Each waveform oscillates between a high voltage signal (HIGH output), such as a digital one, and a low voltage signal (LOW output), such as a digital zero. In timing diagrams 350A-350D, timing generator 200 divides a clock period $t_{CL1}$ of reference timing signal 204 into 128 clock intervals (phases) and selects which clock intervals to generate rising edges and falling edges of timing signal 202 by setting rising edge location signal HPT1POSLOC and falling edge location signal HPT1NEGLOC. For example, in timing diagrams 350A-350C, coarse delay circuit 205 shifts rising edges of coarse delayed rising edge signal 206A to clock interval 54 of reference timing signal 204 and rising edges of coarse delayed falling edge signal 206C to clock interval 72 based respectively on rising edge location signal HPT1POSLOC and falling edge location signal HPT1NEGLOC. In timing diagram 350D, timing generator 200 inverts polarity of the rising edges and falling edges, such that coarse delay circuit 205 shifts rising edges of coarse delayed rising edge signal 206A to clock interval 72 of reference timing signal 204 and rising edges of coarse delayed falling edge signal 206C to clock interval 54 based respectively on rising edge location signal HPT1POSLOC and falling edge location signal HPT1NEGLOC. When timing generator 200 sets rising edge mask control signal HPT1POSMASK and/or falling edge mask control signal HPT1NEGMASK to an active state (a HIGH output), masking circuit 270 holds (masks) coarse delayed rising edge signal 206A and/or coarse delayed falling edge signal 206C from fine delay circuit 250. When timing generator 200 sets rising edge mask control signal HPT1POSMASK and/or falling edge mask control signal HPT1NEGMASK to an active state (a HIGH output), masking circuit 270 passes coarse delayed rising edge signal 206A and/or coarse delayed falling edge signal 206C to fine delay circuit 250. Though not illustrated, timing generator 200 can further shift rising edges of coarse delayed rising edge signal 206A and coarse delayed falling edge signal 206C by fine delay increments (as small as 30 ps). FIGS. 9A-9D have been simplified for the sake of clarity to better understand the inventive concepts of the present disclosure. Additional features can be added in timing diagrams 350A-350D, and some of the features described below can be replaced or eliminated in other embodiments of timing diagrams 350A-350D.

Figure 9A:
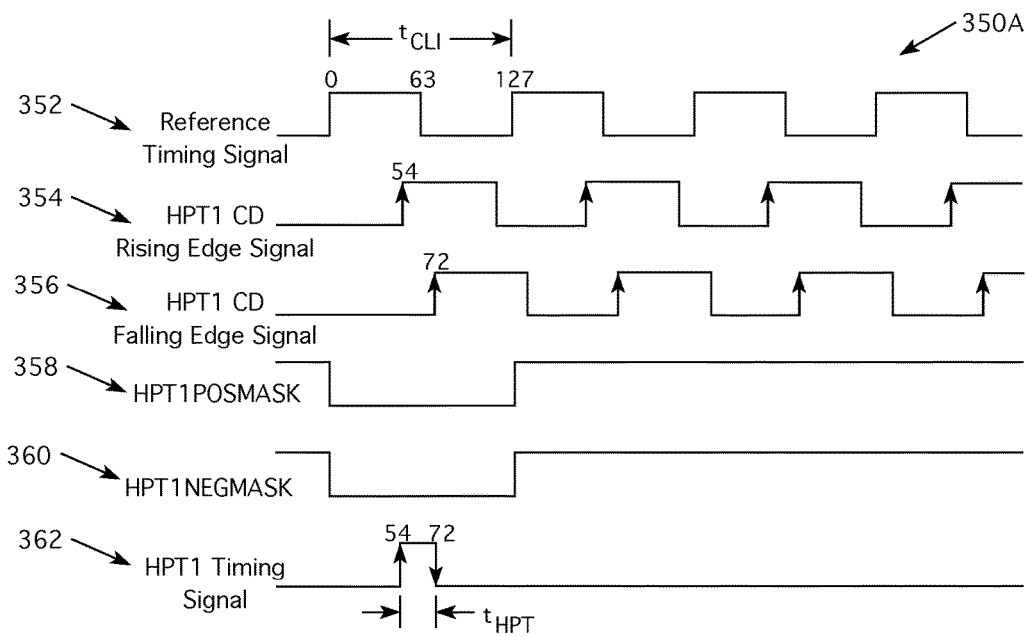
FIGS. 9A-9D are timing diagrams that illustrate states of various signals of a timing generator having a masking circuit, such as the timing generator 200 of FIG. 4, according to various aspects of the present disclosure.
Figure 9B:
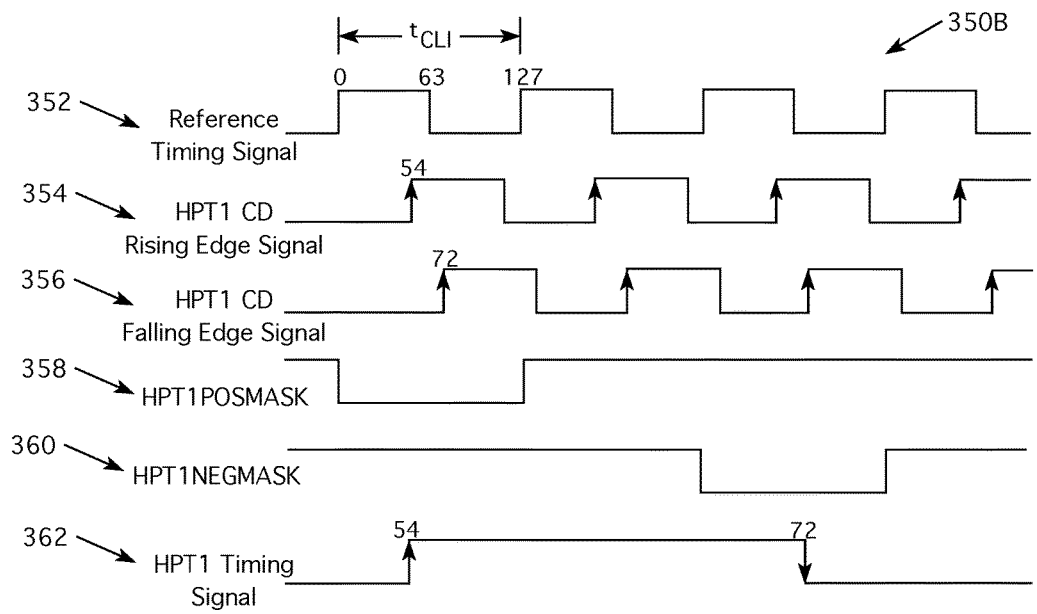
Figure 9C:
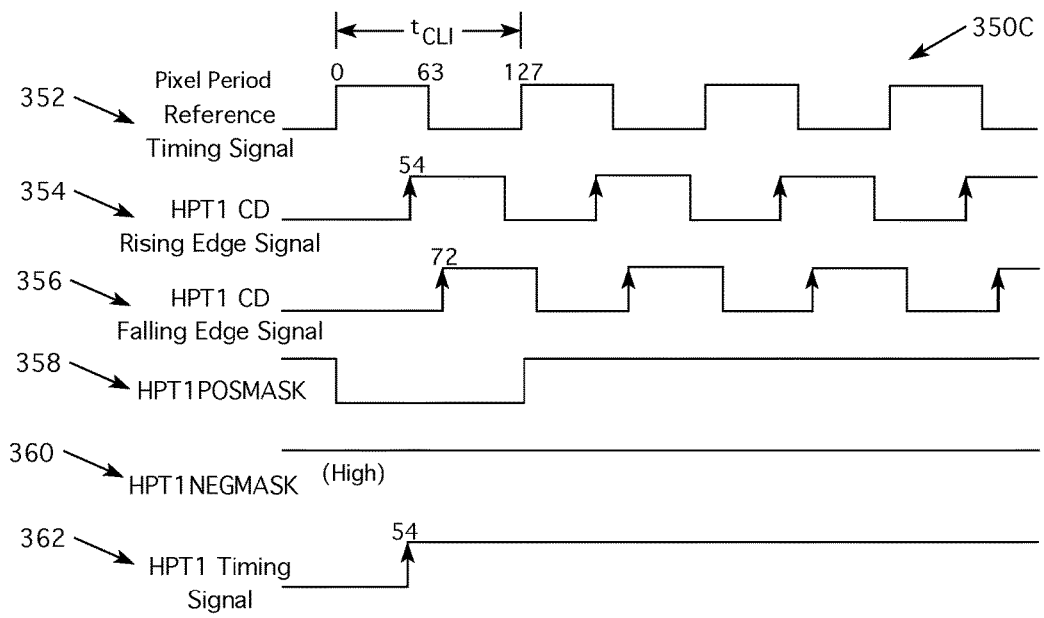
Figure 9D:
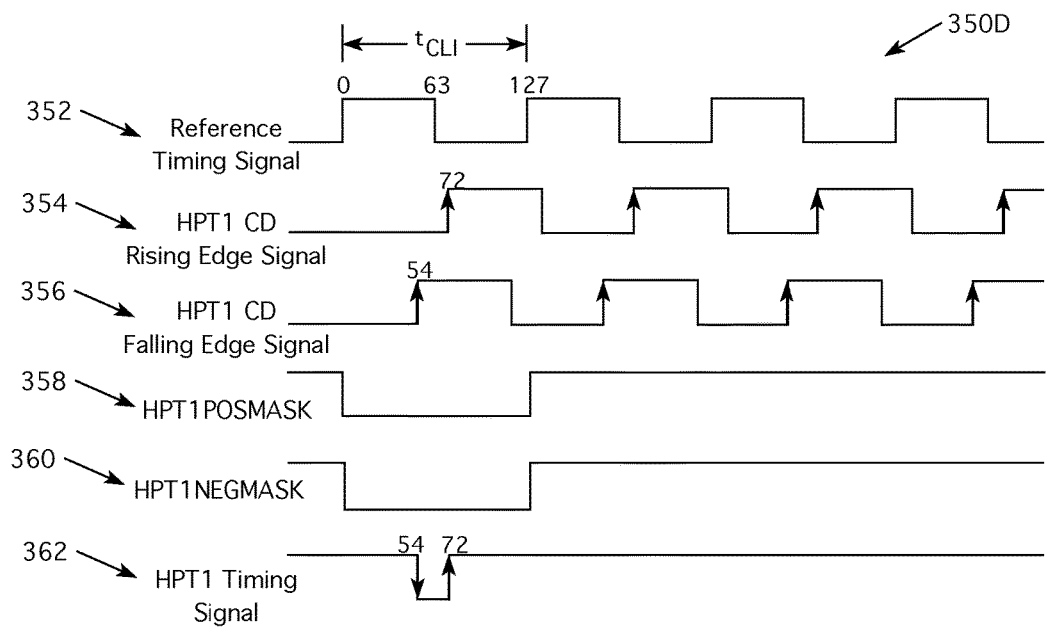

In FIG. 9A, timing diagram 350A illustrates states of various signals when timing generator 200 generates a narrow pulse for timing signal 202, where the narrow pulse has a width less than clock period $t_{CL1}$ of reference timing signal 204. For example, when timing generator 200 sets both rising edge mask control signal HPT1POSMASK and falling edge mask control signal HPT1NEGMASK to an inactive state (LOW) during a same clock period of reference timing signal 204, masking circuit 270 passes coarse delayed rising edge signal 206A and coarse delayed falling edge signal 206C to fine delay circuit 250, such that timing signal 202 includes a pulse having a rising edge (at clock interval 54) and a falling edge (at clock interval 72) within a same clock period. In FIG. 9B, timing diagram 350B illustrates states of various signals when timing generator 200 generates a wide pulse for timing signal 202, where the wide pulse has a width greater than clock period $t_{CL1}$ of reference timing signal 204. For example, when timing generator 200 sets rising edge mask control signal HPT1POSMASK and falling edge mask control signal HPT1NEGMASK to an inactive state (LOW) during different clock periods of reference timing signal 204, masking circuit 270 passes coarse delayed rising edge signal 206A and coarse delayed falling edge signal 206C to fine delay circuit 250 during different clock periods, such that timing signal 202 includes a pulse that spans more than one clock period. For example, timing signal 202 includes a pulse having a rising edge (at clock interval 54) in one clock period and a falling edge (at clock interval 72) two clock periods later, where the pulse has a width of about 2½ clock periods. In FIG. 9C, timing diagram 350C illustrates states of various signals when timing generator 200 generates a single edge pulse for timing signal 202. For example, when timing generator 200 sets only rising edge mask control signal HPT1POSMASK to an inactive state (LOW) over time, masking circuit 270 passes only coarse delayed rising edge signal 206A to fine delay circuit 250, such that timing signal 202 includes a pulse has only rising edge (at clock interval 54). In FIG. 9D, timing diagram 350D illustrates states of various signals when timing generator 200 generates a narrow pulse having inverted starting polarity for timing signal 202, where the narrow pulse has a width less than clock period $t_{CL1}$ of reference timing signal 204. For example, as noted above, coarse delay circuit 205 shifts rising edges of coarse delayed rising edge signal 206A to clock interval 72 of reference timing signal 204 and rising edges of coarse delayed falling edge signal 206C to clock interval 54. When timing generator 200 sets both rising edge mask control signal HPT1POSMASK and falling edge mask control signal HPT1NEGMASK to an inactive state (LOW) during a same clock period of reference timing signal 204, masking circuit 270 passes coarse delayed rising edge signal 206A and coarse delayed falling edge signal 206C to fine delay circuit 250, such that timing signal 202 includes a pulse having a rising edge (at clock interval 72) and a falling edge (at clock interval 54) within a same clock period.

Turning again to FIG. 4, edge combiner 278 is connected with fine delay circuit 250. In the depicted embodiment, edge combiner 278 is positive edge triggered on positive edges of both a rising edge input and a falling edge input, where a rising edge on the rising edge input control a rising edge location of a pulse of timing signal 202 and a rising edge of the falling edge input controls a falling edge location of the pulse of timing signal 202. For example, edge combiner 278 generates timing signal 202 from fine delayed rising edge signal 252A and fine delayed falling edge signal 252B, producing rising edges when edge combiner 278 detects rising edges of fine delayed edge signal 252A and producing falling edges when edge combiner 278 detects rising edges of fine delayed edge signal 252B. In implementations where fine delay circuit 250 is configured between coarse delay circuit 205 and masking circuit 270, edge combiner 278 is connected with masking circuit 270, such that edge combiner 278 generates timing signal 202 from fine delayed rising edge signal 252A and fine delayed falling edge signal 252B as received from masking circuit 270, producing rising edges when edge combiner 278 detects rising edges of fine delayed edge signal 252A and producing falling edges when edge combiner 278 detects rising edges of fine delayed edge signal 252B. The present disclosure contemplates other configurations of timing generator 200 where edge combiner 278 is negative edge triggered on negative edges of a rising edge input, a falling edge input, or both the rising edge input and the falling edge input, where a falling edge on the rising edge input control a rising edge location of the pulse of timing signal 202 and/or a falling edge of the falling edge input controls a falling edge location of the pulse of timing signal 202.

Timing generator 200 can include a timing core (for example, collectively coarse delay circuit 205, fine delay circuit 250, masking circuit 270, and edge combiner 278), a processor core (for example, a processor 280), and a timing generator memory (for example, a memory 285) in electrical communication. Processor 280 and memory 285 may collectively be referred to as a control system 290, which generates digital control signals for controlling a timing of rising edges and falling edges of timing signal 202. The timing core can read timing information from memory 285 that specifies timing locations for rising edges and falling edges of timing signal 202. For example, timing generator 200 reads timing information from memory 285 associated with rising edge location control signal HPT1POSLOC, falling edge location control signal HPT1NEGLOC, rising edge fine delay control signal HPT1POSFD, and falling edge fine delay control signal HPT1NEGFD. In particular, coarse delay circuit 205 can read rising edge location signal HPT1POSLOC and falling edge location signal HPT1NEGLOC from memory 285, and fine delay circuit 250 can read rising edge fine delay control signal HPT1POSFD and falling edge fine delay control signal HPT1NEGFD from memory 285. Processor 280 can cooperate with the timing core to mask (disable) coarse delayed rising edge signal 206A and coarse delayed falling edge signal 206B from fine delay circuit 250. For example, processor 280 generates rising edge mask control signal HPT1POSMASK and falling edge mask control signal HPT1NEGMASK for masking circuit 270.

Figure 10:
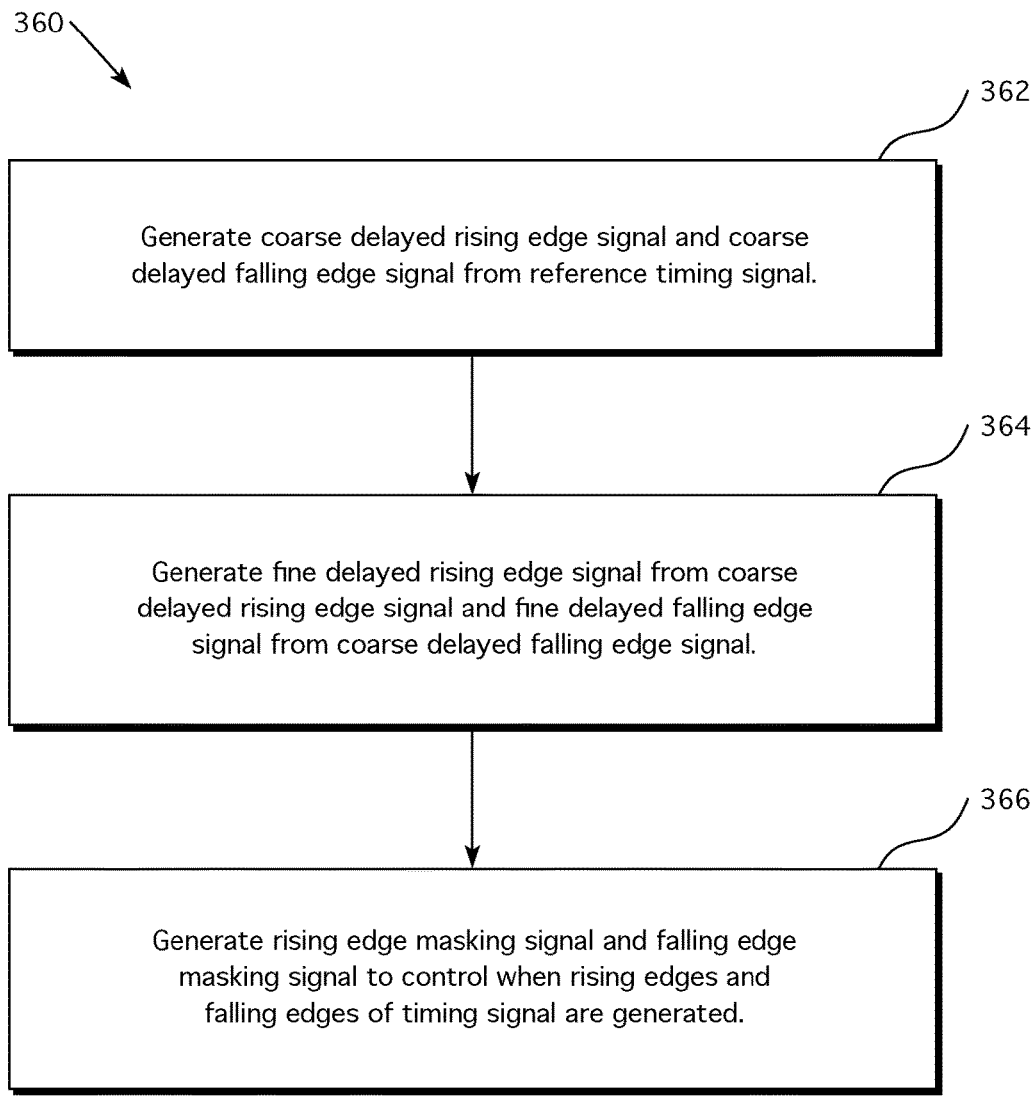
FIG. 10 is a flowchart of an exemplary method 360 for generating a timing signal according to various aspects of the present disclosure.

FIG. 10 is a flowchart of an exemplary method 360 for generating a timing signal according to various aspects of the present disclosure. In various implementations, timing generator 200 implements method 360 for generating timing signal 202. At block 362, a coarse delayed rising edge signal and a coarse delayed falling edge signal are generated from a reference timing signal. At block 364, a fine delayed rising edge signal is generated from the coarse delayed rising edge signal, and a fine delayed falling edge signal is generated from the coarse delayed falling edge signal. At block 366, a rising edge masking signal and a falling edge masking signal are generated to control when rising and falling edges of timing signal are generated. Additional steps can be provided before, during, and after method 360 and some of the steps described can be replaced or eliminated for other embodiments of method 360.

As noted above, though timing generator 200 is described above as a timing mechanism for TOF system 100, timing generator 200 can be implemented in any device or system configuration that necessitates generation of timing signals. Furthermore, the various circuitry configurations described above can be replaced, substituted, or otherwise modified to accommodate various design implementations that achieve the timing signal generating mechanisms described herein. Further, though the depicted FIGURES illustrate timing generator 200 generating timing signal 202, it is understood that timing generator 200 may generate a timing signal for multiple channels. For example, when implemented in TOF system 100, timing generator 200 can generate timing signal 202 for each communication channel of TOF system 100. Accordingly, it is understood that the various components of timing generator 200 may be replicated for each channel.

In various implementations, TOF system 100, timing generator 200, and/or the various the circuits and/or components of TOF system 100 and timing generator 200 can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself.

The various illustrative logical blocks, modules, cores, and circuits described in connection with the aspects disclosed herein and in connection with the FIGURES may be implemented within or performed by an integrated circuit (IC), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. The logical blocks, modules, cores, and circuits may include antennas and/or transceivers to communicate with various components within the network or within the device. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The functionality of the modules or cores may be implemented in some other manner as taught herein. Furthermore, the functionality described herein (e.g., with regard to one or more of the accompanying figures) may correspond in some aspects to similarly designated "means for" functionality in the appended claims.

The functions and/or operations described herein may be implemented in hardware, software, firmware, or any combination thereof. If implemented in software, the functions may be stored on or transmitted over as one or more instructions or code on a tangible, non-transitory medium, such as a non-transitory computer-readable media. Computer-readable media includes both computer storage media and communication media including any medium that facilitates transfer of a computer program from one place to another. A storage media may be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. In summary, it should be appreciated that a computer-readable medium may be implemented in any suitable computer-program product.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare.

This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations, such as the timing signal generation mechanisms, described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for generating a coarse delayed rising edge signal and a coarse delayed falling edge signal from the reference timing signal; means for generating a fine delayed rising edge signal from the coarse delayed rising edge signal and a fine delayed falling edge signal from the coarse delayed falling edge signal; and means for masking the coarse delayed rising edge signal and the coarse delayed falling edge signal to control when rising edges and falling edges of the timing signal are generated from the fine delayed rising edge signal and the fine delayed falling edge signal. The 'means for' in these instances can include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein.

What is claimed is:

1. A timing generator for generating a timing signal, the timing generator comprising:
    a coarse delay circuit configured to generate a coarse delayed rising edge signal and a coarse delayed falling edge signal from a reference timing signal;
    a fine delay circuit configured to generate a fine delayed rising edge signal from the coarse delayed rising edge signal and a fine delayed falling edge signal from the coarse delayed falling edge signal;
    an edge combiner configured to generate the timing signal based on the fine delayed rising edge signal and the fine delayed falling edge signal; and
    a masking circuit configured to generate a rising edge masking signal and a falling edge masking signal for controlling when the rising edges and the falling edges of the timing signal are generated.

2. The timing generator of claim 1, wherein the fine delay circuit includes:

a fine delay rising edge circuit configured to shift edges of coarse delayed rising edge signal by a rising edge fine delay interval; and a fine delay falling edge circuit configured to shift edges of coarse delayed falling edge signal by a falling edge fine delay interval.

3. The timing generator of claim 1, wherein the fine delay circuit has a maximum fine delay interval that overlaps a coarse delay interval of the coarse delay circuit.

4. The timing generator of claim 1, wherein the fine delay circuit is configured to calibrate the coarse delay circuit.

5. The timing generator of claim 1, wherein:
the fine delay rising edge circuit includes at least two fine delay stages connected in series, wherein each fine delay stage includes:
a first delay path for delaying the coarse delayed rising edge signal by a fine delay interval,
a second delay path for passing the coarse delayed rising edge signal without any intentional delay, and
a selection circuit for selecting the first delay path or the second delay path for the coarse delayed rising edge signal; and
the fine delay falling edge circuit includes at least two fine delay stages connected in series, wherein each fine delay stage includes:
a first delay path for delaying the coarse delayed falling edge signal by a fine delay interval,
a second delay path for passing the coarse delayed falling edge signal without any intentional delay, and
a selection circuit for selecting the first delay path or the second delay path for the coarse delayed falling edge signal.

6. The timing generator of claim 5, wherein the selection circuit is configured to select the first delay path or the second delay path by setting a state of a transistor.

7. The timing generator of claim 1, wherein the masking circuit includes:
a rising edge masking circuit configured to mask coarse delayed rising edge signal from fine delay circuit based on the rising edge mask control signal; and
a falling edge masking circuit configured to mask coarse delayed falling edge signal from fine delay circuit based on the falling edge mask control signal.

8. The timing generator of claim 7, further comprising a processor core configured to generate the rising edge mask control signal and the falling edge mask control signal using the reference timing signal as a processor core clock.

9. The timing generator of claim 1, wherein the masking circuit is configured to control a clock period of the reference timing signal in which a rising edge and a falling edge of a pulse of the timing signal is generated.

10. The timing generator of claim 1, wherein the coarse delay circuit is configured to generate a coarse delay control voltage for locking a coarse delay of the coarse delay circuit, and further wherein the fine delay circuit generates the fine delayed rising edge signal and the fine delayed falling edge signal as a function of the coarse delay control voltage.

11. The timing generator of claim 10, wherein the coarse delay circuit includes:
a delay-locked loop based phase generator that includes a delay line configured to generate delay signals from a reference timing signal, each delay signal having a phase delayed relative to the reference timing signal, and a feedback control system configured to generate the coarse delay control voltage for locking a coarse delay of the delay line; and a selection circuit configured to select one of the delay signals for the coarse delayed rising edge signal and one of the delay signals for the coarse delayed falling edge signal.

12. A method for generating a timing signal from a reference signal, the method comprising:
generating a coarse delayed rising edge signal and a coarse delayed falling edge signal from the reference timing signal;
generating a fine delayed rising edge signal from the coarse delayed rising edge signal and a fine delayed falling edge signal from the coarse delayed falling edge signal; and
generating a rising edge masking signal and a falling edge masking signal to control when rising edges and falling edges of the timing signal are generated.

13. The method of claim 12, wherein the generating the coarse delayed rising edge signal and the coarse delayed falling edge signal from the reference timing signal includes:
generating delay signals from the reference timing signal, each delay signal having a phase delayed relative to the reference timing signal; and
selecting one of the delay signals for the coarse delayed rising edge signal based on a rising edge location control signal and one of the delay signals for the coarse delayed falling edge signal based on a falling edge location control signal.

14. The method of claim 12, further including generating a coarse delay control voltage that locks a coarse delay achievable for the coarse delayed rising edge signal and the coarse delayed falling edge signal.

15. The method of claim 14, further including generating the fine delayed rising edge signal and the falling edge rising signal as a function of the coarse delay control voltage.

16. The method of claim 12, wherein:
the generating the fine delayed rising edge signal from the coarse delayed rising edge signal includes selecting a delay path through at least two fine delay stages for the coarse delayed rising edge signal based on a fine delay rising edge control signal; and
the generating the fine delayed falling edge signal from the coarse delayed falling edge signal includes selecting a delay path through at least two fine delay stages for the coarse delayed falling edge signal based on a fine delay falling edge control signal.

17. The method of claim 16, wherein the selecting the delay path includes setting a state of a transistor in each of the at least two fine delay stages.

18. The method of claim 12, wherein:
generating the rising edge mask signal includes setting a clock period of the reference clock signal in which rising edges of the timing signal are generated; and
generating the falling edge mask signal includes setting a clock period of the reference clock signal in which falling edges of the timing signal are generated.

19. The method of claim 18, wherein the rising edge mask signal and the falling edge mask signal are generated at about a clock period of the reference timing signal.

20. The method of claim 12, wherein the timing signal includes a plurality of timing signals, the method further comprising transmitting each of the plurality of timing signals over a respective communication channel.

21. A timing generator system comprising:
means for generating a coarse delayed rising edge signal and a coarse delayed falling edge signal from the reference timing signal;

means for generating a fine delayed rising edge signal from the coarse delayed rising edge signal and a fine delayed falling edge signal from the coarse delayed falling edge signal, wherein a timing signal is generated from the fine delayed rising edge signal and the fine delayed falling edge signal; and means for generating a rising edge masking signal and a falling edge masking signal to control when rising edges and falling edges of the timing signal are generated.

22. The timing generator system of claim 21, further comprising:

means for generating a rising edge mask signal to control a clock period of the reference clock signal in which rising edges of the timing signal are generated; and means generating a falling edge mask signal to control a clock period of the reference clock signal in which falling edges of the timing signal are generated.

23. The timing generator system of claim 21, wherein the means for generating the coarse delayed rising edge signal and the coarse delayed falling edge signal include:

means for generating a coarse delay control voltage, wherein fine delayed rising edge signal and the fine delayed falling edge signal are generated as a function of the coarse delay control voltage.

\* \* \* \* \*